(12) United States Patent
Jiang et al.

(10) Patent No.: US 11,309,505 B2
(45) Date of Patent: Apr. 19, 2022

(54) DISPLAY PANEL AND DISPLAY DEVICE

(71) Applicant: WuHan TianMa Micro-Electronics Co., Ltd., Wuhan (CN)

(72) Inventors: Xue Jiang, Wuhan (CN); Yu Cai, Wuhan (CN); Feng Yu, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 155 days.

(21) Appl. No.: 16/878,597

(22) Filed: May 19, 2020

(65) Prior Publication Data
US 2020/0280010 A1 Sep. 3, 2020

(30) Foreign Application Priority Data
Oct. 31, 2019 (CN) .......................... 201911053989.1

(51) Int. Cl.
*H01L 51/50* (2006.01)
*H01L 27/32* (2006.01)
*H01L 51/52* (2006.01)

(52) U.S. Cl.
CPC .......... *H01L 51/502* (2013.01); *H01L 27/326* (2013.01); *H01L 27/3246* (2013.01); *H01L 51/5044* (2013.01); *H01L 51/5237* (2013.01)

(58) Field of Classification Search
CPC . H01L 51/502; H01L 27/3246; H01L 27/326; H01L 51/5044; H01L 51/5237; H01L 27/3216; H01L 51/5225; H01L 27/322; H01L 27/3227
See application file for complete search history.

(56) References Cited

U.S. PATENT DOCUMENTS

| 2016/0079322 | A1* | 3/2016 | Kim ..................... H01L 27/3246 438/34 |
| 2018/0174515 | A1* | 6/2018 | Joo ........................ G09G 3/3233 |
| 2018/0182827 | A1* | 6/2018 | Kim ..................... H01L 27/3258 |
| 2018/0348574 | A1* | 12/2018 | Lin .................... G02F 1/133603 |
| 2019/0041698 | A1* | 2/2019 | Lin ......................... G06F 3/0412 |
| 2019/0198787 | A1* | 6/2019 | Du ........................... H01L 51/50 |

(Continued)

FOREIGN PATENT DOCUMENTS

| CN | 109065592 A | 12/2018 |
| CN | 109768074 A | 5/2019 |
| CN | 110275358 A | 9/2019 |

*Primary Examiner* — Bitew A Dinke
(74) *Attorney, Agent, or Firm* — Kilpatrick Townsend & Stockton, LLP

(57) ABSTRACT

Disclosed are a display panel and a display device. The display panel includes a substrate and multiple organic light-emitting units located in the display region on a first side of the substrate, where an area of at least one of organic light-emitting units in the second display region is smaller than an area of each of organic light-emitting units with a same light-emitting color in the first display region, and/or, density of the organic light-emitting units in the first display region is greater than density of the organic light-emitting units in the second display region. The second display region includes at least one quantum dot light-emitting unit, which does not overlap the organic light-emitting units; and each of the at least one quantum dot light-emitting unit emits light of a same color as at least one of the organic light-emitting units located in the second display region.

20 Claims, 16 Drawing Sheets

(56) References Cited

U.S. PATENT DOCUMENTS

| | | | | |
|---|---|---|---|---|
| 2019/0378873 A1* | 12/2019 | Lee | ........................ | H01L 33/505 |
| 2020/0096676 A1* | 3/2020 | Ha | ........................ | H01L 51/5275 |
| 2020/0176532 A1* | 6/2020 | Choi | ..................... | H01L 27/3246 |
| 2020/0280009 A1* | 9/2020 | Lin | ...................... | H01L 51/5012 |
| 2020/0343315 A1* | 10/2020 | Lin | ..................... | H01L 27/3246 |

* cited by examiner

DISPLAY PANEL AND DISPLAY DEVICE

CROSS-REFERENCE TO RELATED APPLICATIONS

This application claims priority to Chinese patent application No. 201911053989.1 filed with CNIPA on Oct. 31, 2019, the disclosure of which is incorporated herein by reference in its entirety.

FIELD

The present disclosure relates to the field of display techniques and, in particular, to a display panel and a display device.

BACKGROUND

With the development of science and technology and social progress, people have increasing dependence on information exchange and transmission. As a main carrier and material basis of information exchange and transmission, the display device has become a research hotspot for many scientists.

In order to implement functions such as photographing, it is often necessary to configure a light sensing element in a light sensing element setting region of a display panel. External ambient light may pass through the light sensing element setting region and reach the light sensing element to implement functions such as photographing. The light sensing element setting region may also display images, but the display brightness is lower than the display brightness of a normal display region, and the display effect is affected.

SUMMARY

The present disclosure provides a display panel and a display device, to reduce the difference in display brightness of different regions in the display region and improve the display effect.

One embodiment of the present disclosure provides a display panel including a display region, where the display region includes a first display region and a second display region.

The display panel includes a substrate and multiple organic light-emitting units.

The multiple organic light-emitting units are located in the display region on a first side of the substrate; where an area of at least one of the organic light-emitting units in the second display region is smaller than an area of each of the organic light-emitting units with a same light-emitting color in the first display region, and/or density of the organic light-emitting units in the first display region is greater than density of the organic light-emitting units in the second display region.

The second display region includes at least one quantum dot light-emitting unit, and the at least one quantum dot light-emitting unit does not overlap the organic light-emitting units in a direction perpendicular to a plane where the display panel is located; and each of the at least one quantum dot light-emitting unit emits light of a same color as at least one of the organic light-emitting units located in the second display region.

One embodiment of the present disclosure provides a display device including a display panel, which includes a substrate and multiple organic light-emitting units. The multiple organic light-emitting units are located in the display region on a first side of the substrate; where an area of at least one of the organic light-emitting units in the second display region is smaller than an area of each of the organic light-emitting units with a same light-emitting color in the first display region, and/or density of the organic light-emitting units in the first display region is greater than density of the organic light-emitting units in the second display region. The second display region includes at least one quantum dot light-emitting unit, and the at least one quantum dot light-emitting unit does not overlap the organic light-emitting units in a direction perpendicular to a plane where the display panel is located; and each of the at least one quantum dot light-emitting unit emits light of a same color as at least one of the organic light-emitting units located in the second display region.

DETAILED DESCRIPTION

Figure 1:
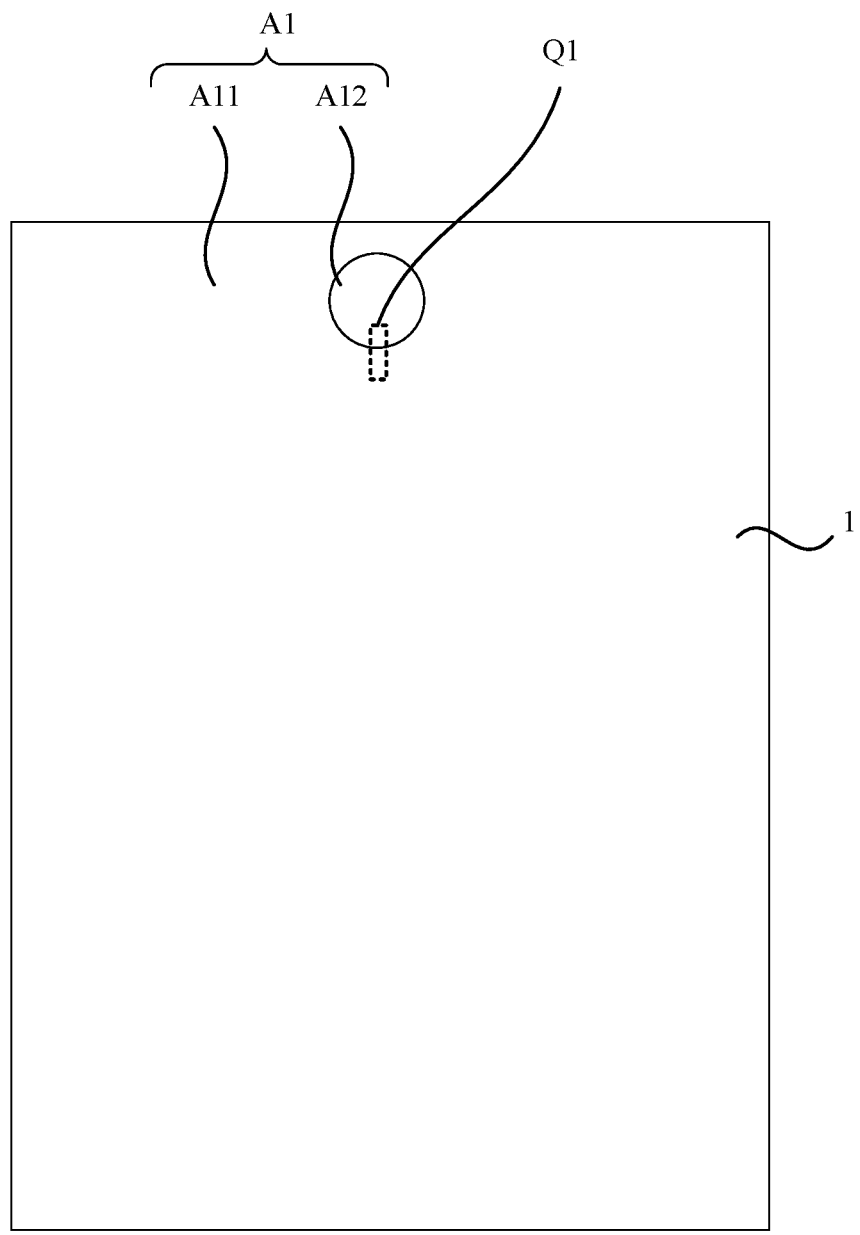
FIG. 1 is a schematic top view of a display panel according to an embodiment of the present disclosure.

Hereinafter the present disclosure will be further described in detail in conjunction with the drawings and embodiments. It can be understood that the some embodiments set forth below are intended to illustrate and not to limit the present disclosure. Additionally, it is to be noted that, for convenience of description, only part, not all, of the structures related to the present disclosure are illustrated in the drawings.

Figure 2:
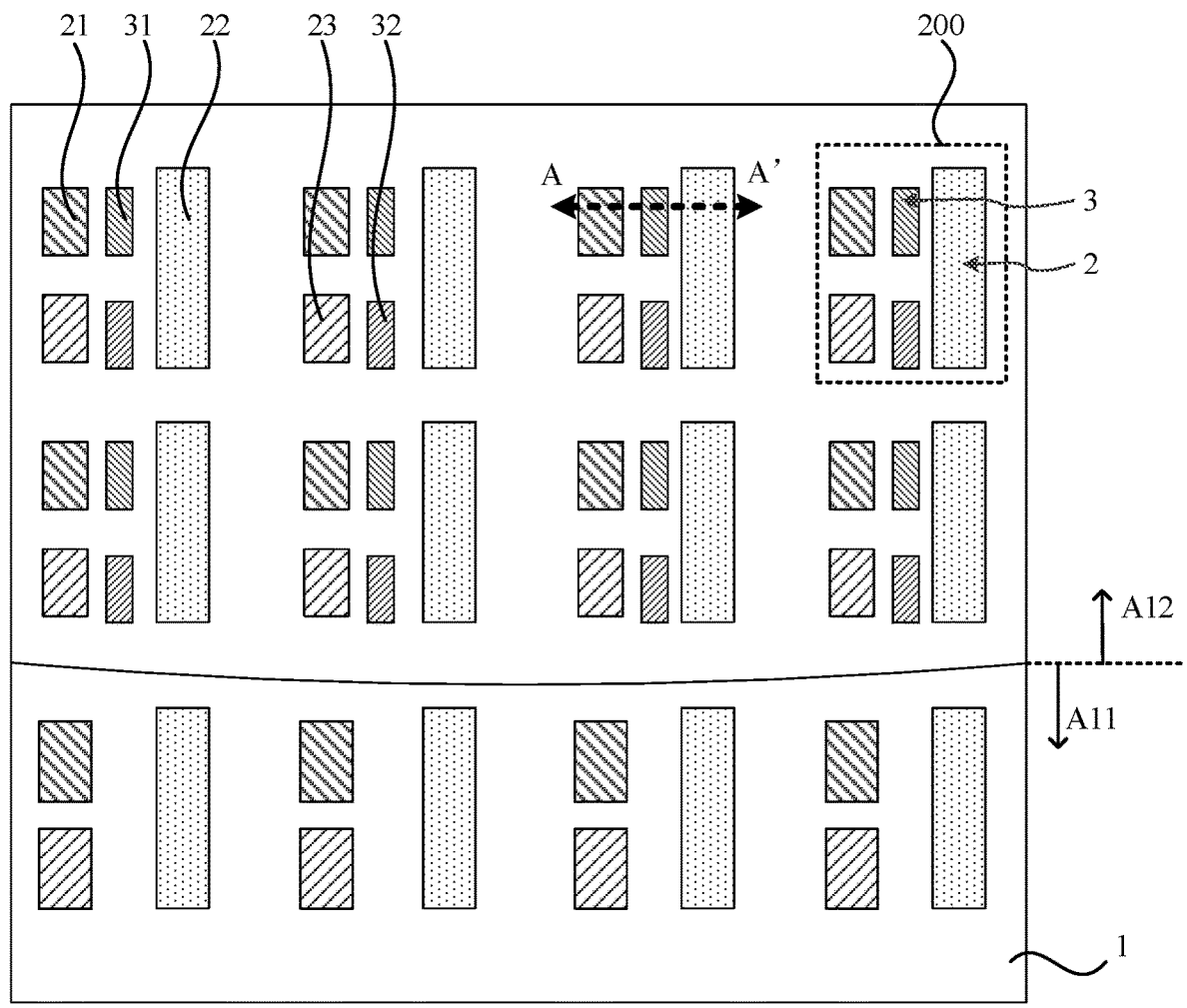
FIG. 2 is a schematic enlarged structure view along region Q1 of FIG. 1.
Figure 3:
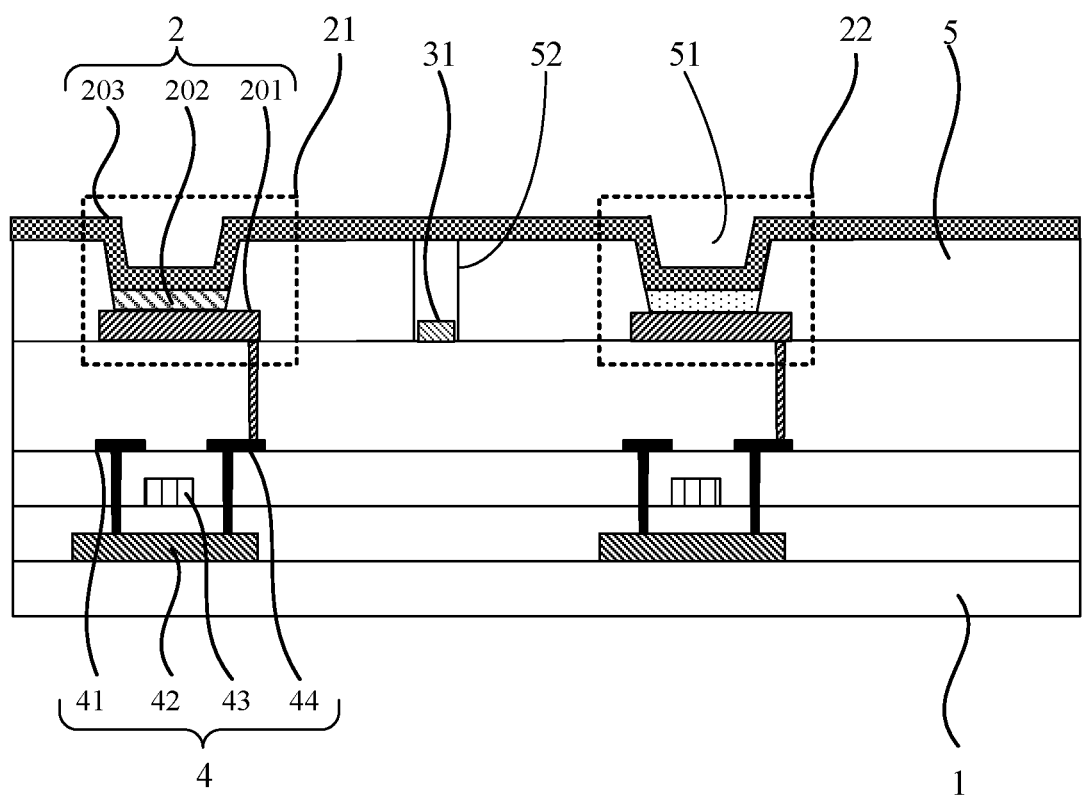
FIG. 3 is a schematic cross-sectional view of FIG. 2 taken along an AA' direction.

FIG. 1 is a schematic top view of a display panel according to an embodiment of the present disclosure, FIG. 2 is a schematic enlarged structure view along region Q1 of FIG. 1, and FIG. 3 is a schematic cross-sectional view of FIG. 2 taken along an AA' direction. Referring to FIGS. 1, 2 and 3, the display panel includes a display region A1, and the display region A1 includes a first display region A11 and a second display region A12. The display panel includes a substrate 1 and multiple organic light-emitting units 2. Multiple organic light-emitting units 2 are located in the display region A1 on the first side of the substrate 1. An image displayed on the display panel may be controlled by controlling the light-emitting brightness of the multiple organic light-emitting units 2. The area of at least one organic light-emitting unit 2 in the second display region A12 is smaller than the area of each light-emitting unit 2 with the same light-emitting color in the first display region A11, and/or the density of organic light-emitting units 2 in the first display region A11 is greater than the density of organic light-emitting units 2 in the second display region A12. The second display region A12 includes at least one quantum dot light-emitting unit 3, and the at least one quantum dot light-emitting unit 3 does not overlap the organic light-emitting units 2 in a direction perpendicular to a plane where the display panel is located. One quantum dot light-emitting unit 3 emits light of a same color as at least one organic light-emitting unit 2 located in the second display region A12.

In the embodiment of the present disclosure, the area of at least one organic light-emitting unit in the second display region is smaller than the area of each organic light-emitting unit with the same light-emitting color in the first display region, and/or the density of organic light-emitting units in the first display region is greater than the density of organic light-emitting units in the second display region, so that the second display region has a higher light transmittance. In one embodiment, a light sensing element may be provided in the second display region so that external ambient light may pass through the second display region and reach the light sensing element to implement functions such as photographing. Since the area of the organic light-emitting unit in the second display region is smaller than the area of the organic light-emitting unit in the first display region, and/or the density of organic light-emitting units in the first display region is greater than the density of organic light-emitting units in the second display region, the area of the organic light-emitting unit per unit area in the second display region is smaller, the area of the organic light-emitting unit per unit area in the first display region is larger, the display brightness of the second display region will be lower than the display brightness of the first display region, and display uniformity of the display panel is affected. In the embodiment of the present disclosure, quantum dot light-emitting units are further provided in the second display region. In a direction perpendicular to a plane where the display panel is located, the quantum dot light-emitting units and the organic light-emitting units are staggered, so that the quantum dot light-emitting units do not block light emitted by the organic light-emitting units in the forward direction, may use the light emitted by the organic light-emitting units and emit visible light under the excitation by means of the light emitted by the organic light-emitting units, and therefore display brightness of the second display region is improved to balance display brightness of the first display region and the second display region, reduce the difference in display brightness of different regions in the display region and improve the display effect. It should be further noted that in the quantum dot light-emitting unit, the quantum dot material is small in thickness and has a high light transmittance. The quantum dot light-emitting unit does not reduce the light transmittance of the second display region while compensating for brightness. In addition, it can be understood that the area of the organic light-emitting unit per unit area in the second display region is smaller. In order to make the brightness of the second display region and the first display region more consistent, it is necessary to increase the current of the organic light-emitting unit in the second display region to compensate for the brightness of the organic light-emitting unit in the second display region, and the current density of the organic light-emitting unit in the second display region is increased, and an increase in the current density of the organic light-emitting unit will cause a reduction in the service life of the organic light-emitting unit. In the embodiment of the present disclosure, the quantum dot light-emitting unit is used to compensate for the brightness so that the current density of the organic light-emitting unit in the second display region can be reduced, and it is beneficial for improving the service life of the organic light-emitting unit in the second display region.

In an embodiment, referring to FIGS. 2 and 3, multiple organic light-emitting units 2 include a first organic light-emitting unit 21 and a second organic light-emitting unit 22, the first organic light-emitting unit 21 is configured to emit light in a first waveband, and the second organic light-emitting unit 22 is configured to emit light in a second waveband. A wavelength of the light in the first waveband is greater than a wavelength of the light in the second waveband. The quantum dot light-emitting unit 3 includes a first quantum dot light-emitting unit 31, a vertical projection of the first quantum dot light-emitting unit 31 on a plane where the substrate 1 is located is a first quantum dot pattern, a vertical projection of the first organic light-emitting unit 21 on the plane where the substrate 1 is located is a first organic pattern, the first quantum dot pattern is adjacent to the first organic pattern, and the first quantum dot light-emitting unit 31 converts the light of the second waveband irradiating the first quantum dot light-emitting unit 31 into the light of the first waveband. That is, the first quantum dot light-emitting unit 31 absorbs the light in the second waveband having a shorter wavelength and emits light in the first waveband having a longer wavelength. In the embodiment of the present disclosure, the first quantum dot light-emitting unit 31 is disposed adjacent to the first organic light-emitting unit 21, and the first quantum dot light-emitting unit 31 absorbs light emitted by the second organic light-emitting unit 22 and emits the light of a same color as the first organic light-emitting unit 21. Thereby, the display brightness of the second display region A12 is increased to balance the display brightness of the first display region A11 and the second display region A12, reduce the difference in display brightness of different regions in the display region A1, and improve the display effect.

In an embodiment, referring to FIGS. 2 and 3, the display panel includes multiple pixels 200 arranged in an array, and one pixel 200 includes at least a first organic light-emitting unit 21, a second organic light-emitting unit 22 and a first quantum dot light-emitting unit 31. It is to be noted that in FIG. 2, one pixel 200 including three organic light-emitting units (i.e., the first organic light-emitting unit 21, the second organic light-emitting unit 22 and the third organic light-emitting unit 23) is used as an example for explanation, and is not intended to limit the embodiment of the present disclosure. In the embodiment of the present disclosure, the number of organic light-emitting units in one pixel 200 is not limited. In a feasible embodiment, one pixel 200 may merely include the first organic light-emitting unit 21 and the second organic light-emitting unit 22, and not include the third organic light-emitting unit 23. In another feasible embodiment, one pixel 200 may include at least four organic light-emitting units.

In an embodiment, referring to FIGS. 2 and 3, the light in the first waveband is red light, and the light in the second waveband is blue light. The light emitted by the first organic light-emitting unit 21 is red light, and the light emitted by the second organic light-emitting unit 22 is blue light. The blue light emitted from the second organic light-emitting unit 22 irradiates the first quantum dot light-emitting unit 31 and excites the first quantum dot light-emitting unit 31 to emit red light. In other embodiments, the light in the first waveband is red light, and the light in the second waveband may further be green light; or the light in the first waveband is green light, and the light in the second waveband is blue light, which is not limited in the embodiment of the present disclosure.

In an embodiment, referring to FIGS. 2 and 3, multiple organic light-emitting units 2 include a third organic light-emitting unit 23, the third organic light-emitting unit 23 is configured to emit light in a third waveband, the third waveband does not overlap the first waveband, and a wavelength of the light in the third waveband is greater than the wavelength of the light in the second waveband. The quantum dot light-emitting unit 3 further includes a second quantum dot light-emitting unit 32, a vertical projection of the second quantum dot light-emitting unit 32 on a plane where the substrate 1 is located is a second quantum dot pattern, a vertical projection of the third organic light-emitting unit 23 on the plane where the substrate 1 is located is a third organic pattern, the second quantum dot pattern is adjacent to the third organic pattern, and the second quantum dot light-emitting unit 32 converts the light in the second waveband irradiating the second quantum dot light-emitting unit 32 into the light in the third waveband. In the embodiment of the present disclosure, multiple organic light-emitting units 2 include the first organic light-emitting unit 21, the second organic light-emitting unit 22 and the third organic light-emitting unit 23. The first quantum dot light-emitting unit 31 is disposed adjacent to the first organic light-emitting unit 21, and the first quantum dot light-emitting unit 31 absorbs light emitted by the second organic light-emitting unit 22 and emits light of a same color as the first organic light-emitting unit 21. The second quantum dot light-emitting unit 32 is disposed adjacent to the third organic light-emitting unit 23, and the second quantum dot light-emitting unit 32 absorbs light emitted by the second organic light-emitting unit 22 and emits light of a same color as the third organic light-emitting unit 23. Therefore, display brightness of the second display region A12 is increased to balance display brightness of the first display region A11 and the second display region A12, reduce the difference in display brightness of different regions in the display region A11 and improve the display effect.

Exemplarily, referring to FIGS. 2 and 3, the light in the first waveband is red light, the light in the second waveband is blue light, and the light in the third waveband is green light. The light emitted by the first organic light-emitting unit 21 is red light, the light emitted by the second organic light-emitting unit 22 is blue light, and the light emitted by the third organic light-emitting unit 22 is green light. The blue light emitted from the second organic light-emitting unit 22 irradiates the first quantum dot light-emitting unit 31 and excites the first quantum dot light-emitting unit 31 to emit red light. The blue light emitted from the second organic light-emitting unit 22 irradiates the second quantum dot light-emitting unit 32 and excites the second quantum dot light-emitting unit 32 to emit green light.

Exemplarily, referring to FIGS. 2 and 3, the light emitted by the first organic light-emitting unit 21 is red light, the light emitted by the second organic light-emitting unit 22 is blue light, and the light emitted by the third organic light-emitting unit 23 is green light. The area of the first organic light-emitting unit 21 in the second display region A12 is smaller than the area of the first organic light-emitting unit 21 in the first display region A11, the area of the third organic light-emitting unit 23 in the second display region A12 is smaller than the area of the third organic light-emitting unit 23 in the first display region A11, and the area of the second organic light-emitting unit 22 in the second display region A12 is equal to the area of the second organic light-emitting unit 22 in the first display region A11. In the embodiment of the present disclosure, the light emitted by the second organic light-emitting unit 22 is blue light. Due to the limitation of the material, at the same current density, the service life of the second organic light-emitting unit 22 that emits blue light is shorter than the service life of the first organic light-emitting unit 21 that emits red light, and the service life of the second organic light-emitting unit 22 that emits blue light is also shorter than the service life of the third organic light-emitting unit 23 that emits green light. In the second display region A12, since the area of the second organic light-emitting unit 22 is not reduced when the first organic light-emitting unit 21 and the third organic light-emitting unit 23 are reduced in area in the embodiment of the present disclosure, the second organic light-emitting unit 22 has a large area, so the current density of the second organic light-emitting unit 22 may be appropriately reduced to increase the service life of the second organic light-emitting unit 22 and balance the service life of the first organic light-emitting unit 21, the second organic light-emitting unit 22 and the third organic light-emitting unit 23.

In an embodiment, referring to FIGS. 2 and 3, the display panel includes multiple quantum dot light-emitting units 3. In the second display region A12, any first organic light-emitting unit 21 has at least one quantum dot light-emitting unit 3 disposed adjacent to the first organic light-emitting unit 21 and emitting light of a same color as the first organic light-emitting unit 21. In the second display region A12, any third organic light-emitting unit 23 has at least one quantum dot light-emitting unit 3 disposed adjacent to the third organic light-emitting unit 23 and emitting light of a same color as the third organic light-emitting unit 23. In the embodiment of the present disclosure, in the second display region A12, any first organic light-emitting unit 21 has at least one quantum dot light-emitting unit 3 disposed adjacent to the first organic light-emitting unit 21 and emitting light of the same color as the first organic light-emitting unit 21, and any third organic light-emitting unit 23 has at least one quantum dot light-emitting unit 3 disposed adjacent to the third organic light-emitting unit 23 and emitting light of the same color as the third organic light-emitting unit 23. That is to say, all the first organic light-emitting units 21 and all the third organic light-emitting units 23 in the second display region A12 are provided with corresponding quantum dot light-emitting units 3, and the display brightness of all regions in the second display region A12 is uniformly increased to balance not only the display brightness of different regions in the second display region A12 but also the display brightness of the first display region A11 and the second display region A12. It is to be noted that in other embodiments, the quantum dot light-emitting units 3 may also be located merely in part of the second display region A12.

In an embodiment, referring to FIGS. 2 and 3, the first quantum dot light-emitting unit 31 is located between one first organic light-emitting unit 21 and one second organic light-emitting unit 22, and the second quantum dot light-emitting unit 32 is located between one third organic light-emitting unit 23 and one second organic light-emitting unit 22. In the embodiment of the present disclosure, since the first quantum dot light-emitting unit 31 and the adjacent first organic light-emitting unit 21 emit light of a same color, and the light-emitting process of the first quantum dot light-emitting unit 31 requires excitation by means of the light emitted by the second organic light-emitting unit 22, the first quantum dot light-emitting unit 31 is located between one first organic light-emitting unit 21 and one second organic light-emitting unit 22, so that the first quantum dot light-emitting unit 31 is adjacent to the first organic light-emitting unit 21 and adjacent to the second organic light-emitting unit 22, which is beneficial for increasing the light intensity of the light emitted by the second organic light-emitting unit 22 to the first quantum dot light-emitting unit 31. Since the second quantum dot light-emitting unit 32 and the adjacent third organic light-emitting unit 23 emit light of a same color, and the light-emitting process of the second quantum dot light-emitting unit 32 requires excitation by means of the light emitted by the second organic light-emitting unit 22, the second quantum dot light-emitting unit 32 is located between one third organic light-emitting unit 23 and one second organic light-emitting unit 22, so that the second quantum dot light-emitting unit 32 is adjacent to the third organic light-emitting unit 23 and adjacent to the second organic light-emitting unit 22, which is beneficial for increasing the light intensity of the light emitted by the second organic light-emitting unit 22 to the second quantum dot light-emitting unit 32.

Exemplarily, referring to FIG. 2, the display panel includes multiple pixels 200 arranged in an array, the first quantum dot light-emitting unit 31 is located between the first organic light-emitting unit 21 and the second organic light-emitting unit 22 in a same pixel 200, and the second quantum dot light-emitting unit 32 is located between the third organic light-emitting unit 23 and the second organic light-emitting unit 22 in a same pixel 200. The pixel 200 is the smallest image display unit during light-emitting display. The color displayed by the pixel 200 is often not merely the color of light emitted by the first organic light-emitting unit 21, the second organic light-emitting unit 2 or the third organic light-emitting unit 23, but is a color of mixed light of light emitted by the first organic light-emitting unit 21, the second organic light-emitting unit 22 and the third organic light-emitting unit 23. Therefore, when the first organic light-emitting unit 21 emits light, the second organic light-emitting unit 22 in the same pixel 200 will always excite the first quantum dot light-emitting unit 31 to emit light of a same color as the first organic light-emitting unit 21. When the third organic light-emitting unit 23 emits light, the second organic light-emitting unit 22 in the same pixel 200 will always excite the second quantum dot light-emitting unit 32 to emit light of a same color as the third organic light-emitting unit 23.

Figure 4:
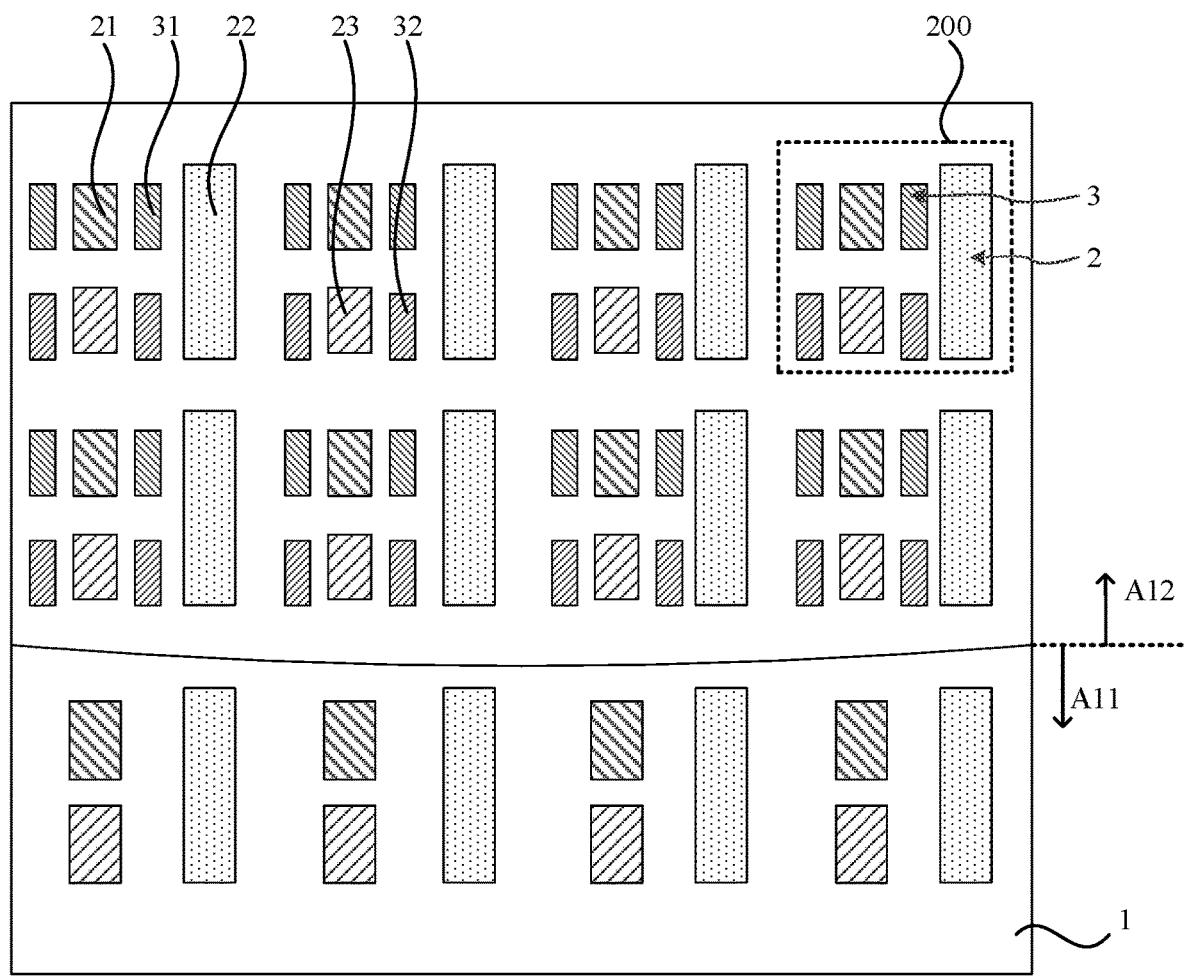
FIG. 4 is a top view of a portion of another display panel according to an embodiment of the present disclosure.

FIG. 4 is a top view of a portion of another display panel according to an embodiment of the present disclosure.

Referring to FIG. 4, one pixel 200 includes two first quantum dot light-emitting units 31 and two second quantum dot light-emitting units 32. The first organic light-emitting unit 21 is located between the two first quantum dot light-emitting units 31, and the first organic light-emitting unit 21 and the first quantum dot light-emitting unit 31 have a same light-emitting color. One first quantum dot light-emitting unit 31 is located between the first organic light-emitting unit 21 and the second organic light-emitting unit 22 in the same pixel 200, and the other first quantum dot light-emitting unit 31 is located between the first organic light-emitting unit 21 in the same pixel 200 and a second organic light-emitting unit 22 in an adjacent pixel 200. The third organic light-emitting unit 23 is located between the two second quantum dot light-emitting units 32, and the third organic light-emitting unit 23 and the second quantum dot light-emitting unit 32 have a same light-emitting color. One second quantum dot light-emitting unit 32 is located between the third organic light-emitting unit 23 and the second organic light-emitting unit 22 in the same pixel 200, and the other second quantum dot light-emitting unit 32 is located between the third organic light-emitting unit 23 in the same pixel 200 and the second organic light-emitting unit 22 in an adjacent pixel 200. In the embodiment of the present disclosure, one first organic light-emitting unit 21 has two first quantum dot light-emitting units 31 adjacent to the first organic light-emitting unit 21 and emitting light of a same color as the first organic light-emitting unit 21, and one third organic light-emitting unit 23 has two second quantum dot light-emitting units 32 adjacent to the third organic light-emitting unit 23 and emitting light of a same color as the third organic light-emitting unit 23. Therefore, the display brightness of the second display region A12 is further increased to balance the display brightness of the first display region A11 and the second display region A12.

In an embodiment, referring to FIGS. 2 and 4, the pixel 200 includes a first organic light-emitting unit 21, a second organic light-emitting unit 22 and a third organic light-emitting unit 23, the first organic light-emitting unit 21 is configured to emit red light, the second organic light-emitting unit 22 is configured to emit blue light, and the third organic light-emitting unit 23 is configured to emit green light. In each pixel 200, the first organic light-emitting unit 21, the second organic light-emitting unit 22 and the third organic light-emitting unit 23 are arranged in two columns, the first organic light-emitting unit 21 and the third organic light-emitting unit 23 are arranged in a same column along the column direction of the array, and the second organic light-emitting unit 22 and the first organic light-emitting unit 21 are located in different columns. In other embodiments, the display panel may also have other arrangement manners of a pixel, and the arrangement manner of a pixel is not limited in the present disclosure.

Figure 5:
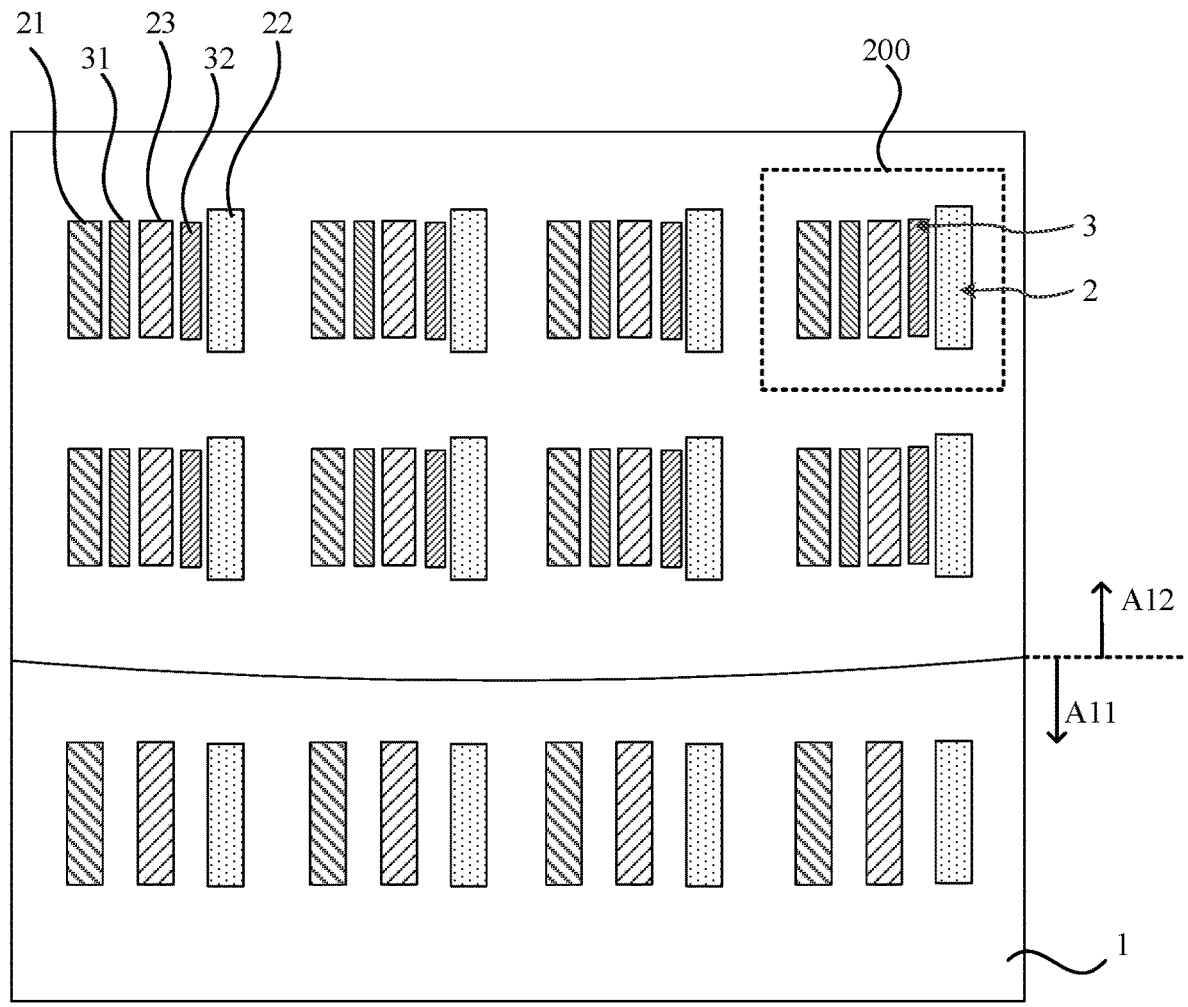
FIG. 5 is a top view of a portion of another display panel according to an embodiment of the present disclosure.

FIG. 5 is a top view of a portion of another display panel according to an embodiment of the present disclosure. Referring to FIG. 5, a pixel 200 includes a first organic light-emitting unit 21, a second organic light-emitting unit 22 and a third organic light-emitting unit 23. The first organic light-emitting unit 21 is configured to emit red light, the second organic light-emitting unit 22 is configured to emit blue light, and the third organic light-emitting unit 23 is configured to emit green light. In each pixel 200, the first organic light-emitting unit 21, the second organic light-emitting unit 22 and the third organic light-emitting unit 23 are arranged along a row direction of the array. Multiple pixels 200 are arranged in a matrix.

Exemplarily, referring to FIG. 5, a first quantum dot light-emitting unit 31 is located between the first organic light-emitting unit 21 and the second organic light-emitting unit 22, and more often, the first quantum dot light-emitting unit 31 is located between the first organic light-emitting unit 21 and the third organic light-emitting unit 23, and the first quantum dot light-emitting unit 31 emits red light under the excitation by means of the blue light emitted by the second organic light-emitting unit 22. The second quantum dot light-emitting unit 32 is located between the third organic light-emitting unit 23 and the second organic light-emitting unit 22. The second quantum dot light-emitting unit 32 emits green light under the excitation by means of the blue light emitted by the second organic light-emitting unit 22.

Figure 6:
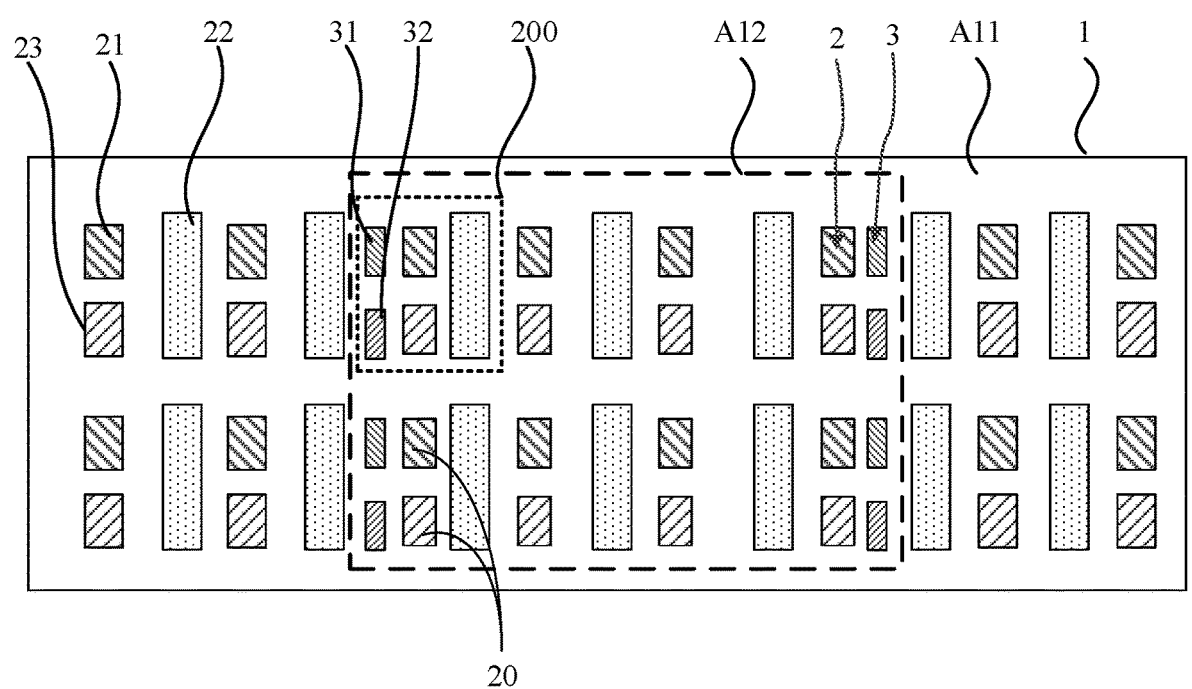
FIG. 6 is a top view of a portion of another display panel according to an embodiment of the present disclosure.

FIG. 6 is a top view of a portion of another display panel according to an embodiment of the present disclosure. Referring to FIG. 6, a second display region A12 includes a first edge organic light-emitting unit 20 closest to a first display region A11, and no other organic light-emitting units 2 that emit light of a same color as the first edge organic light-emitting unit 20 is included between the first edge organic light-emitting unit 20 and an organic light-emitting unit 2 closest to the second display region A12 in the first display region A11. Exemplarily, when the first edge organic light-emitting unit 20 is a first organic light-emitting unit 21, no other first organic light-emitting units 21 is included between the first edge organic light-emitting unit 20 and the organic light-emitting unit 2 closest to the second display region A12 in the first display region A11. When the first edge organic light-emitting unit 20 is a third organic light-emitting unit 23, no other third organic light-emitting units 23 is included between the first edge organic light-emitting unit 20 and the organic light-emitting unit 2 closest to the second display region A12 in the first display region A11. Any first edge organic light-emitting unit 20 has at least one quantum dot light-emitting unit 3 disposed adjacent to the first edge organic light-emitting unit 20 and emitting light of a same color as the first edge organic light-emitting unit 20. In the embodiment of the present disclosure, in the second display region A12, at least one quantum dot light-emitting unit 3 is disposed adjacent to the first edge organic light-emitting unit 20 and emits light of a same color as the first edge organic light-emitting unit 20, the quantum dot light-emitting unit 3 is merely located at the edge of the second display region adjacent to the first display region A11, and the quantum dot light-emitting unit located at the edge will compensate for the brightness of the second display region, so that the brightness transition from the first display region to the second display region of the display panel is more smooth, and the boundary line of brightness between the first display region and the second display region is eliminated. At the same time, the second display region is provided with quantum dot light-emitting units merely at the edges, which can eliminate the boundary line between light and dark and minimize the impact on the light transmittance of the second display region; in addition, in the second display region A12, the organic light-emitting unit 2 other than the first edge organic light-emitting unit 20 is not provided with the quantum dot light-emitting unit 3, and the number of quantum dot light-emitting units 3 is reduced. When the inkjet printing method is used, the number of quantum dot light-emitting units 3 is reduced, and the manufacturing difficulty of the quantum dot light-emitting units 3 can be reduced.

Figure 7:
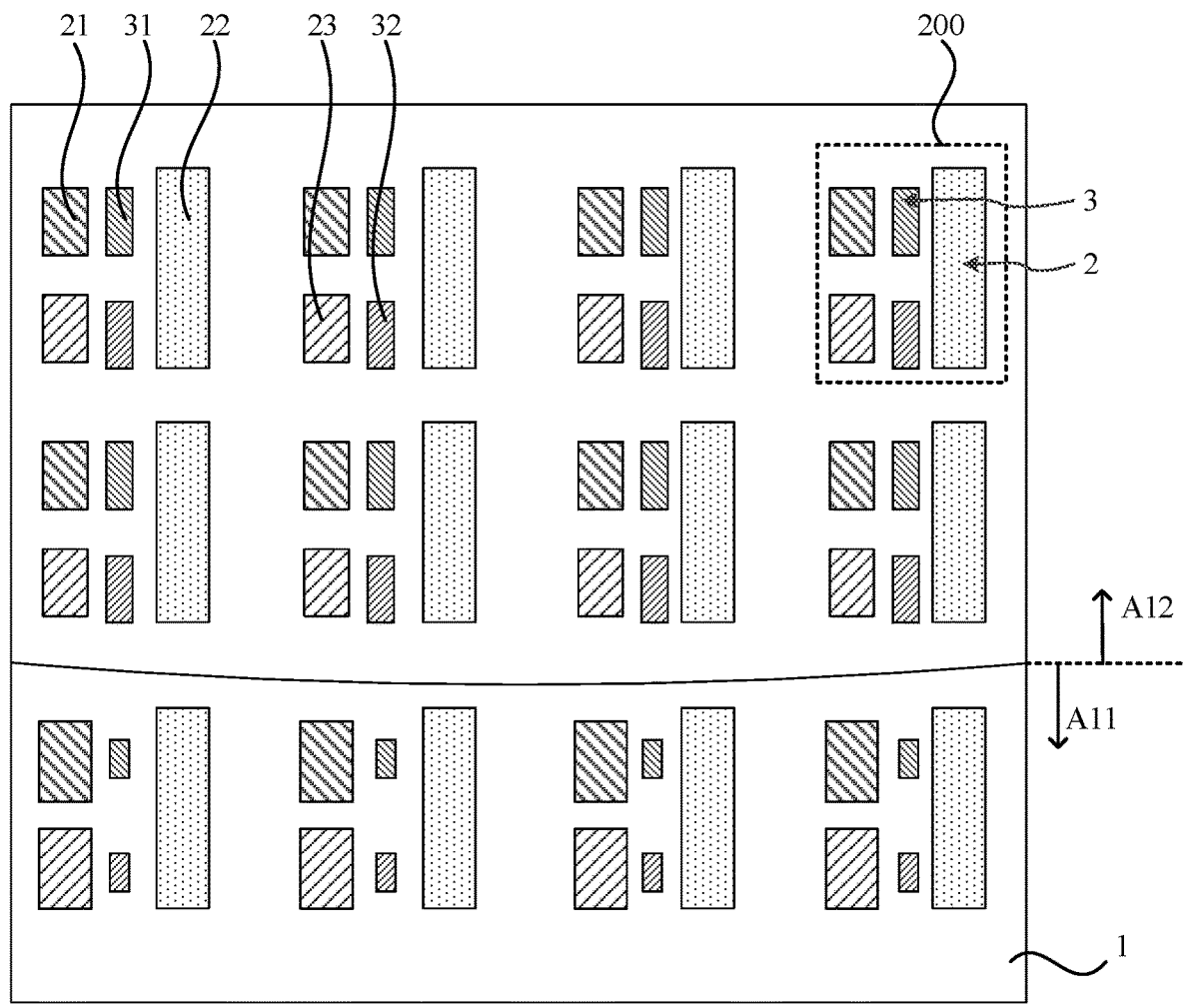
FIG. 7 is a top view of a portion of another display panel according to an embodiment of the present disclosure.

FIG. 7 is a top view of a portion of another display panel according to an embodiment of the present disclosure. Referring to FIG. 7, a first display region A11 includes at least one quantum dot light-emitting unit 3, and the area of a quantum dot light-emitting unit 3 located in the first display region A11 is smaller than the area of a quantum dot light-emitting unit 3 of a same light-emitting color located in a second display region A12. In the embodiment of the present disclosure, the first display region A11 and the second display region A12 are each provided with quantum dot light-emitting units 3, the area of the quantum dot light-emitting unit 3 located in the first display region A11 is smaller than the area of the quantum dot light-emitting unit 3 of a same light-emitting color in the second display region A12, and the light-emitting brightness of the quantum dot light-emitting unit 3 located in the first display region A11 is lower than the light-emitting brightness of the quantum dot light-emitting unit 3 located in the second display region A12, and the display brightness of the first display region A11 and the display brightness of the second display region A11 are balanced. Since an emission wavelength of the organic light-emitting unit 2 and an emission wavelength of the quantum dot light-emitting unit 3 which is adjacent to and emits a same color as the organic light-emitting unit 2 are not exactly the same, the first display region A11 and the second display region A12 each are provided with quantum dot light-emitting units 3, and the light-emitting chromaticity of the first display region A11 and the light-emitting chromaticity of the second display region A12 are balanced, and the display effect is improved.

Figure 8:
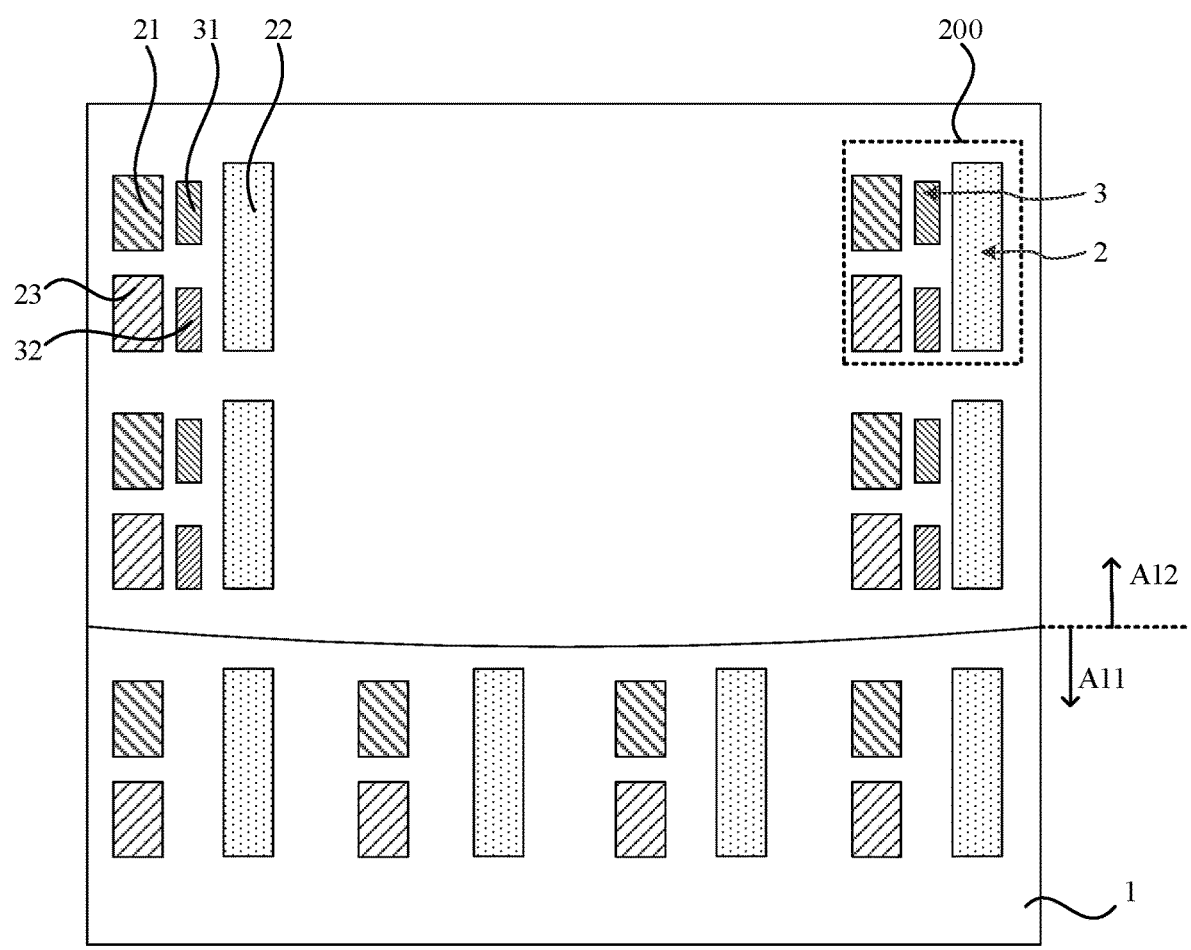
FIG. 8 is a top view of a portion of another display panel according to an embodiment of the present disclosure.

FIG. 8 is a top view of a portion of another display panel according to an embodiment of the present disclosure. Referring to FIG. 8, the density of the organic light-emitting units 2 in the first display region A11 is greater than the density of the organic light-emitting units 2 in the second display region A12. Pixel density of the first display region A11 is greater than the pixel density of the second display region A12. The second display region A12 includes at least one quantum dot light-emitting unit 3, and one quantum dot light-emitting unit 3 and at least one organic light-emitting unit 2 located in the second display region A12 emit light of a same color. Therefore, the display brightness of the second display region is increased to balance the display brightness of the first display region and the second display region.

Figure 9:
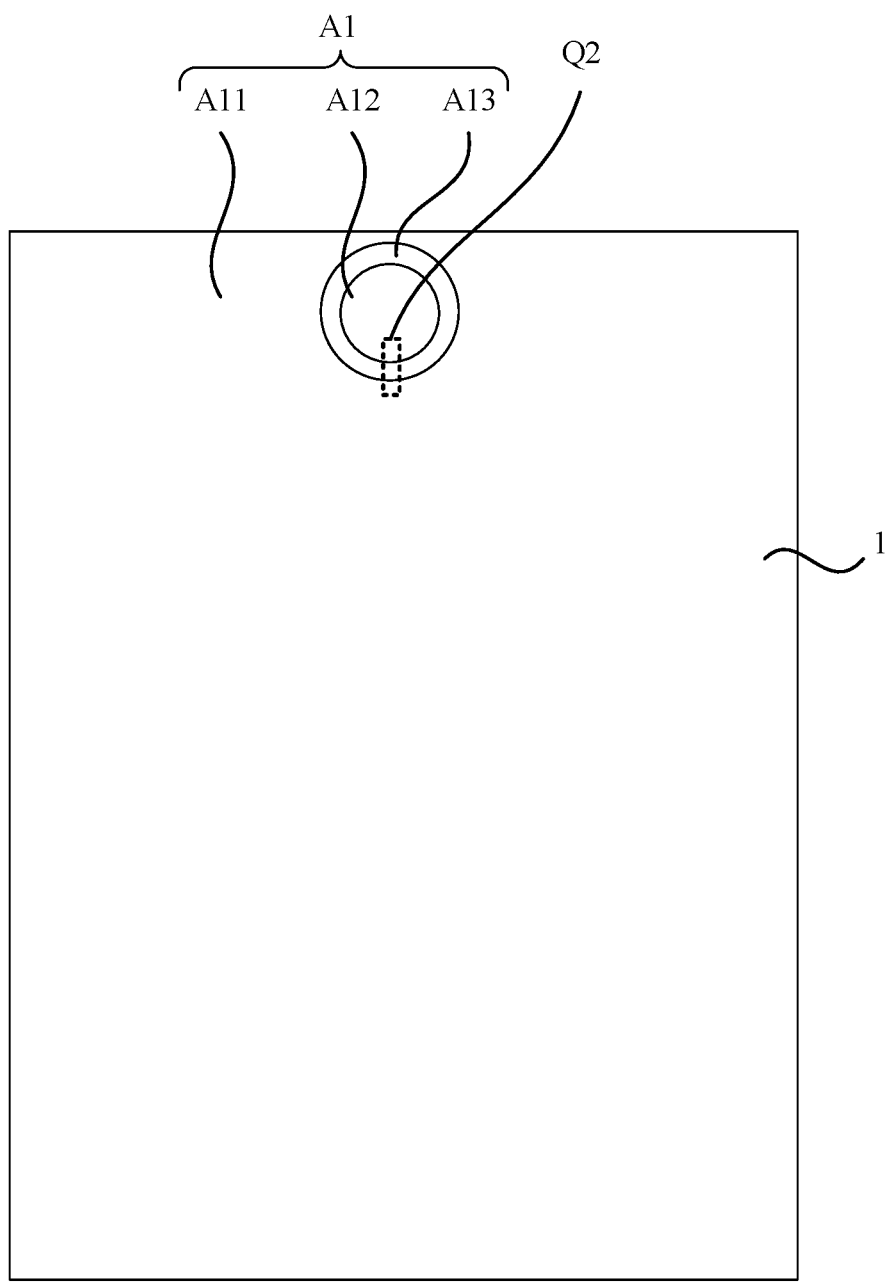
FIG. 9 is a schematic top view of another display panel according to an embodiment of the present disclosure.
Figure 10:
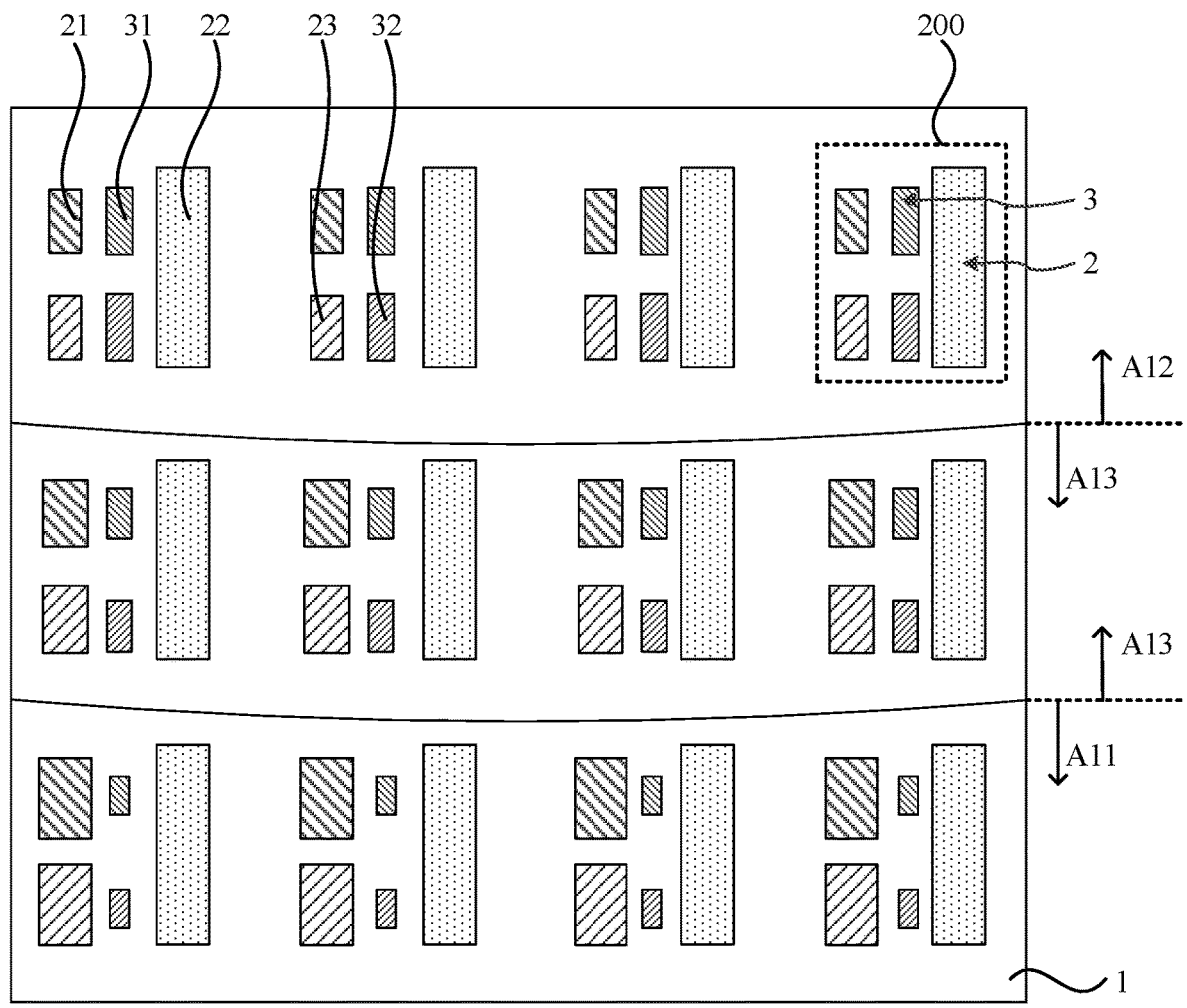
FIG. 10 is a schematic enlarged structure view along region Q2 of FIG. 9.

FIG. 9 is a schematic top view of another display panel according to an embodiment of the present disclosure, and FIG. 10 is a schematic enlarged structure view along region Q2 of FIG. 9. Referring to FIGS. 9 and 10, a display region A1 further includes a third display region A13 located between a first display region A11 and a second display region A12, and multiple quantum dot light-emitting units 3 are located at least in the second display region A12 and the third display region A13. An area of at least one organic light-emitting unit 2 in the second display region A12 is smaller than an area of each organic light-emitting unit 2 with a same light-emitting color in the third display region A13, and an area of at least one organic light-emitting unit 2 in the third display region A13 is smaller than an area of each organic light-emitting unit 2 with a same light-emitting color in the first display region A11. The area of the quantum dot light-emitting unit 3 located in the second display region A12 is larger than the area of the quantum dot light-emitting unit 3 with a same light-emitting color located in the third display region A13. The quantum dot light-emitting unit 3 with a larger area in the second display region A12 performs brightness compensation for the organic light-emitting unit 2 with a smaller area, and the quantum dot light-emitting unit 3 with a smaller area in the third display region A13 performs brightness compensation for the organic light-emitting unit 2 with a larger area in the third display region A13, and the difference in display brightness between the second display region A12 and the third display region A13 is reduced. When the quantum dot light-emitting unit 3 is used to compensate for the brightness of the organic light-emitting unit 2 in the second display region A12, the display brightness of the first display region A11 and the display brightness of the second display region A12 are also difficult to be exactly the same, that is, actual display panel products have great difficulty in implementing ideal compensation for display brightness. In the embodiment of the present disclosure, the third display region A13 is located between the first display region A11 and the second display region A12, the display brightness of the third display region A13 is between the display brightness of the first display region A11 and the display brightness of the second display region A12, and the third display region A13 is a transition region located between the first display region A11 and the second display region A12. Based on reducing the brightness difference between the first display region A11 and the second display region A12, with the display panel provided in the embodiment of the present disclosure, the brightness difference between two adjacent display regions (between the first display region A11 and the third display region A13; and between the third display region A13 and the second display region A12) is reduced, and the display effect is further improved.

In an embodiment, referring to FIGS. 9 and 10, multiple quantum dot light-emitting units 3 are further located in the first display region A11. The first display region A11, the second display region A12 and the third display region A13 are each provided with quantum dot light-emitting units 3. An area of the quantum dot light-emitting unit 3 located in the first display region A11 is smaller than an area of the quantum dot light-emitting unit 3 with a same light-emitting color located in the third display region A13, an area of the quantum dot light-emitting unit 3 located in the third display region A13 is smaller than an area of the quantum dot light-emitting unit 3 with a same light-emitting color located in the second display region A12, the light-emitting brightness of the quantum dot light-emitting unit 3 located in the first display region A11 is smaller than the light-emitting brightness of the quantum dot light-emitting unit 3 located in the third display region A13, and the light-emitting brightness of the quantum dot light-emitting unit 3 located in the third display region A13 is smaller than the light-emitting brightness of the quantum dot light-emitting unit 3 located in the second display region A12, and the display brightness of the first display region A11, the second display region A12 and the third display region A13 is balanced. Since an emission wavelength of the organic light-emitting unit 2 and an emission wavelength of the quantum dot light-emitting unit 3 which is adjacent to and emits a same color as the organic light-emitting unit 2 are not exactly the same, the first display region A11, the second display region A12 and the third display region A13 are each provided with quantum dot light-emitting units 3, and the light-emitting chromaticity of the first display region A11, the second display region A12 and the third display region A13 is balanced and the display effect is improved.

Figure 11:
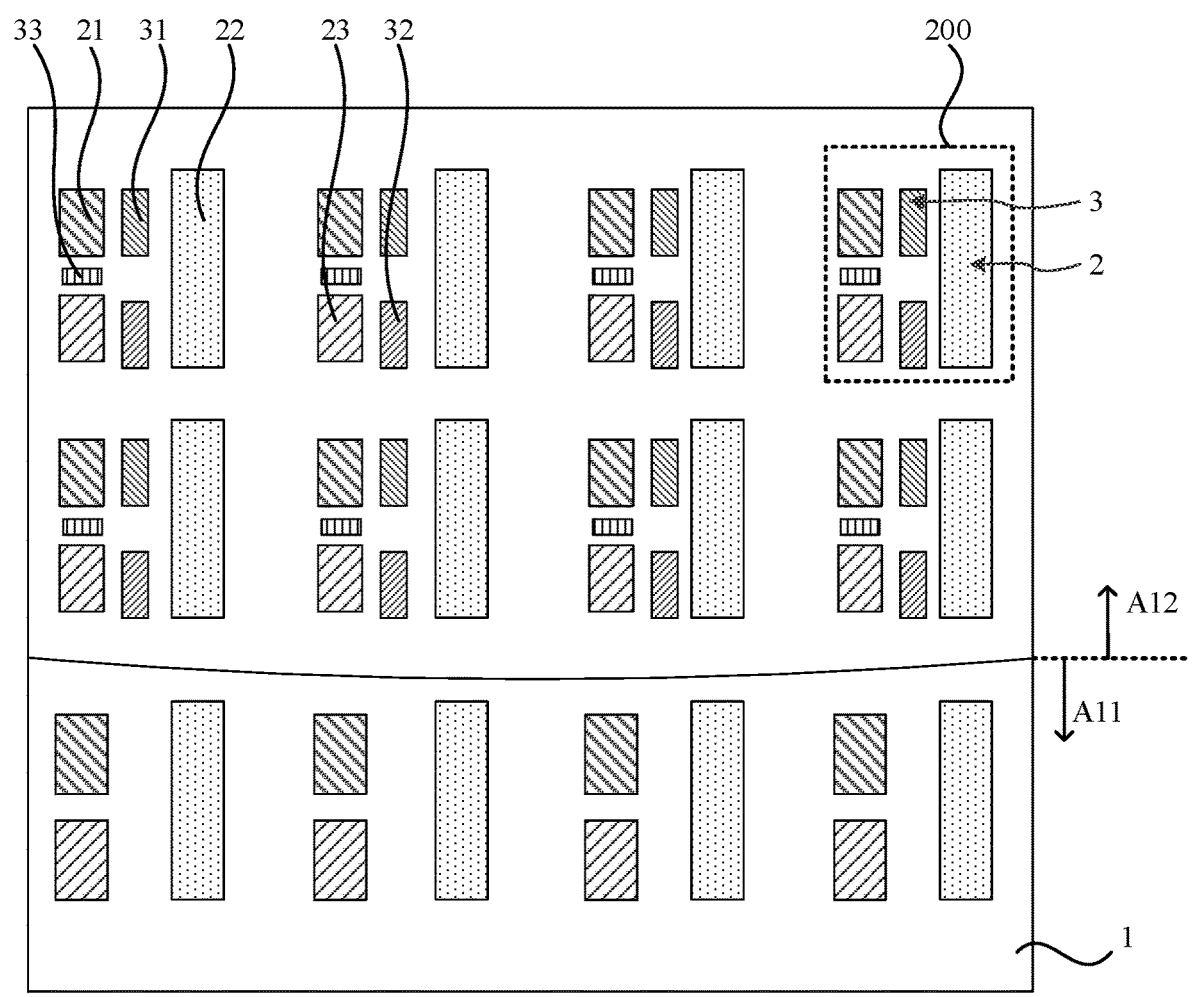
FIG. 11 is a cross-sectional view of a portion of another display panel according to an embodiment of the present disclosure.

FIG. 11 is a cross-sectional view of a portion of another display panel according to an embodiment of the present disclosure. Referring to FIG. 11, a quantum dot light-emitting unit 3 may further include a third quantum dot light-emitting unit 33 located in a second display region A12. In a direction perpendicular to a plane where the display panel is located, the third quantum dot light-emitting unit 33 does not overlap a first quantum dot light-emitting unit 31 or a second quantum dot light-emitting unit 32, and the third quantum dot light-emitting unit 33, the first quantum dot light-emitting unit 31 and the second quantum dot light-emitting unit 32 are staggered. A vertical projection of the third quantum dot light-emitting unit 33 on a plane where the substrate 1 is located is a third quantum dot pattern, a vertical projection of the first organic light-emitting unit 21 on the plane where the substrate 1 is located is a first organic pattern, the third quantum dot pattern is adjacent to the first organic pattern, and the third quantum dot light-emitting unit 33 converts the light in the third waveband irradiating the third quantum dot light-emitting unit 33 into the light in the first waveband. A wavelength of the light in the first waveband is greater than a wavelength of the light in the third waveband. In the embodiment of the present disclosure, multiple organic light-emitting units 2 include a first organic light-emitting unit 21, a second organic light-emitting unit 22 and a third organic light-emitting unit 23. The first quantum dot light-emitting unit 31 is disposed adjacent to the first organic light-emitting unit 21, and the first quantum dot light-emitting unit 31 absorbs light emitted by the second organic light-emitting unit 22 and emits light of a same color as the first organic light-emitting unit 21. The third quantum dot light-emitting unit 33 is also disposed adjacent to the first organic light-emitting unit 21, and the third quantum dot light-emitting unit 33 absorbs light emitted by the third organic light-emitting unit 23 and emits light of a same color as the first organic light-emitting unit 21. Therefore, display brightness of the second display region A12 is increased to balance display brightness of the first display region A11 and the second display region A12, reduce the difference in display brightness of different regions in the display region A11 and improve the display effect.

Exemplarily, referring to FIG. 11, the light in the first waveband is red light, the light in the second waveband is blue light, and the light in the third waveband is green light. The light emitted by the first organic light-emitting unit 21 is red light, the light emitted by the second organic light-emitting unit 22 is blue light, and the light emitted by the third organic light-emitting unit 22 is green light. The blue light emitted from the second organic light-emitting unit 22 irradiates the first quantum dot light-emitting unit 31 and excites the first quantum dot light-emitting unit 31 to emit red light. The green light emitted from the third organic light-emitting unit 23 irradiates the third quantum dot light-emitting unit 33 and excites the third quantum dot light-emitting unit 33 to emit red light. The blue light emitted from the second organic light-emitting unit 22 irradiates the second quantum dot light-emitting unit 32 and excites the second quantum dot light-emitting unit 32 to emit green light.

Figure 12:
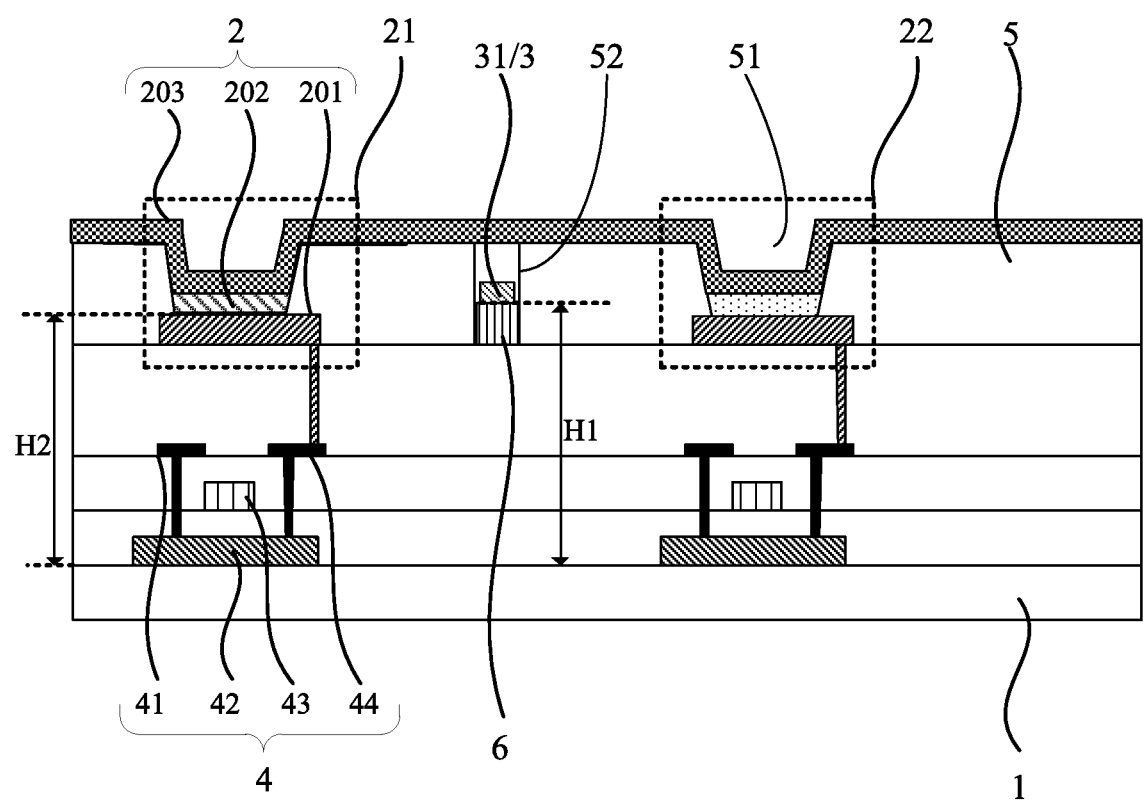
FIG. 12 is a cross-sectional view of a portion of another display panel according to an embodiment of the present disclosure.

FIG. 12 is a cross-sectional view of a portion of another display panel according to an embodiment of the present disclosure. Referring to FIG. 12, an organic light-emitting unit 2 includes a first electrode 201, a light-emitting function layer 202 and a second electrode 203, and the light-emitting function layer 202 is located between the first electrode 201 and the second electrode 203. In a direction perpendicular to a plane where the substrate 1 is located, a minimum distance between the quantum dot light-emitting unit 3 and the substrate 1 is greater than or equal to a minimum distance between the light-emitting function layer 202 and the substrate 1. If the minimum distance between the quantum dot light-emitting unit 3 and the substrate 1 is smaller than the minimum distance between the light-emitting function layer 202 and the substrate 1, the quantum dot light-emitting unit 3 is located on a side of the light-emitting function layer 202 facing toward the substrate 1, and light emitted by the organic light-emitting unit 2 is at least partially blocked by the first electrode 201. In the embodiment of the present disclosure, the minimum distance between the quantum dot light-emitting unit 3 and the substrate 1 is H1, the minimum distance between the light-emitting function layer 202 and the substrate 1 is H2, H1 is greater than or equal to H2, and the light emitted by the organic light-emitting unit 2 will not be blocked by the first electrode 201, and the intensity of light irradiating the quantum dot light-emitting unit 3 is increased, and the light-emitting brightness of the quantum dot light-emitting unit 3 is increased. Exemplarily, referring to FIG. 12, the first electrode 201 is located between the light-emitting function layer 202 and the substrate 1. The first electrode 201 may be a reflective electrode, and the second electrode 203 may be a transflective electrode. The light-emitting function layer 202 may include a light-emitting material layer and an auxiliary light-emitting layer. The auxiliary light-emitting layer may include at least one of a hole injection layer, a hole transport layer, an electron blocking layer, a hole blocking layer, an electron transport layer, or an electron injection layer. The display panel may further include multiple thin film transistors 4, and the thin film transistors 4 are located between the first electrode 201 and the substrate 1. The thin film transistor 4 includes a source electrode 41, a drain electrode 44, a gate electrode 43, and a semiconductor layer 42. The drain electrode 44 of the thin film transistor 4 is electrically connected to the first electrode 201 and is used for controlling the light-emitting brightness of the organic light-emitting unit 2.

In an embodiment, referring to FIG. 12, the display panel further includes a pixel defining layer 5, the pixel defining layer 5 is provided with multiple first openings 51 in the display region A1, the first opening 51 exposes the first electrode 201, and the organic light-emitting unit 2 is located in the first opening 51. The pixel defining layer 5 is further provided with at least one second opening 52 in the display region A1, and the quantum dot light-emitting unit 3 is located in the second opening 52. In the embodiment of the present disclosure, the second opening 52 is provided in the pixel defining layer 5. In a direction perpendicular to a plane where the substrate 1 is located, the second opening 52 does not overlap the first opening 51, and the second opening 52 and the first opening 51 are staggered. The quantum dot light-emitting unit 3 is located in the second opening 52. Since the pixel defining layer 5 is etched at the second opening 52 to have a smaller thickness, the second opening 52 increases the light transmittance, increases the transmittance of light emitted by the quantum dot light-emitting unit 3, and increases the intensity of the light emitted by the quantum dot light-emitting unit 3 to the outside of the display panel.

In an embodiment, referring to FIG. 12, the second opening 52 and the first opening 51 may use a same mask and are formed in a same process, and the process is simplified. In other embodiments, the second opening 52 and the first opening 51 may be formed in two different processes, which is not limited in embodiments of the present disclosure.

In an embodiment, referring to FIG. 12, the second opening 52 penetrates the pixel defining layer 5, the display panel further includes a spacer layer 6 located in the second opening 52, and the spacer layer 6 is located between the substrate 1 and the quantum dot light-emitting unit 3. The spacer layer 6 may be made of a transparent material. The transparent material refers to a material having a transmittance greater than or equal to a preset value, in one embodiment, a material having a transmittance greater than or equal to 99%. The transparent material may be an organic material, an inorganic material or a metal oxide material. The spacer layer 6 may include, in one embodiment, a silicon nitride material or a silicon oxide material. In the embodiment of the present disclosure, in the direction perpendicular to the plane where the substrate 1 is located, the spacer layer 6 increases the distance between the quantum dot light-emitting unit 3 and the substrate 1, so that the quantum dot light-emitting unit 3 is flush with the light-emitting function layer 202, or the quantum dot light-emitting unit 3 is located on a side of the light-emitting function layer 202 facing away from the substrate 1, and the quantum dot light-emitting unit 3 is located on the forward light-emitting side of the light-emitting function layer 202, and the intensity of light irradiating the quantum dot light-emitting unit 3 is increased, and the light emission brightness of the quantum dot light-emitting unit 3 is increased.

Figure 13:
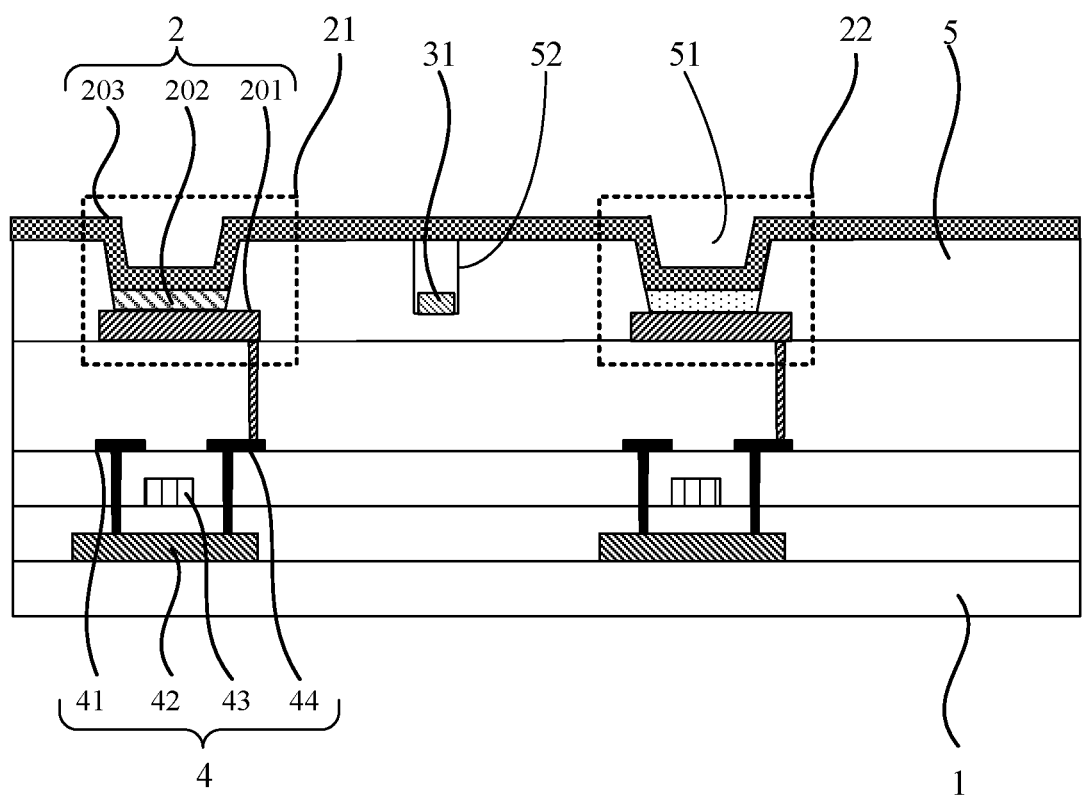
FIG. 13 is a cross-sectional view of a portion of another display panel according to an embodiment of the present disclosure.

FIG. 13 is a cross-sectional view of a portion of another display panel according to an embodiment of the present disclosure, referring to FIG. 13, a depth of the second opening 52 in the thickness direction of the display panel is smaller than the thickness of the pixel defining layer 5, and the pixel defining layer 5 is exposed at a bottom of the second opening 52. The bottom of the second opening 52 is an end of the second opening 52 close to the substrate 1. In the embodiment of the present disclosure, the second opening 52 is a blind hole provided in the pixel defining layer 5, and the quantum dot light-emitting unit 3 is located in the second opening 52. In a direction perpendicular to a plane where the substrate 1 is located, the pixel defining layer 5 between the quantum dot light-emitting unit 3 and the substrate 1 increases the distance between the quantum dot light-emitting unit 3 and the substrate 1, so that the quantum dot light-emitting unit 3 is flush with the light-emitting function layer 202, or the quantum dot light-emitting unit 3 is located on a side of the light-emitting function layer 202 facing away from the substrate 1, and the quantum dot light-emitting unit 3 is located on the forward light-emitting side of the light-emitting function layer 202, and the intensity of light irradiating the quantum dot light-emitting unit 3 is increased, and the light-emitting brightness of the quantum dot light-emitting unit 3 is increased.

In an embodiment, referring to FIG. 13, in the direction perpendicular to the plane where the substrate 1 is located, the minimum distance between the bottom of the second opening 52 and the surface of the pixel defining layer 5 facing toward the substrate 1 is equal to the minimum distance between the surface of the light-emitting function layer 202 facing toward the substrate and the surface of the pixel defining layer 5 facing toward the substrate 1. The first opening 51 and the second opening 52 may be formed by using an exposure, development and etching process by means of yellow light. When the photoresist coated on the pixel defining layer 5 is exposed, a same mask may be used to block or expose the first opening 51 and the second opening 52; and when the pixel defining layer 5 is etched by using an etching solution, since the bottom of the second opening 52 and the first electrode 201 have a same height, a same thickness of the pixel defining layer 5 may be etched in the same time to form the first opening 51 and the second opening 52 at the same time, which is helpful for simplifying the process and reducing the difficulty of the process.

Figure 14:
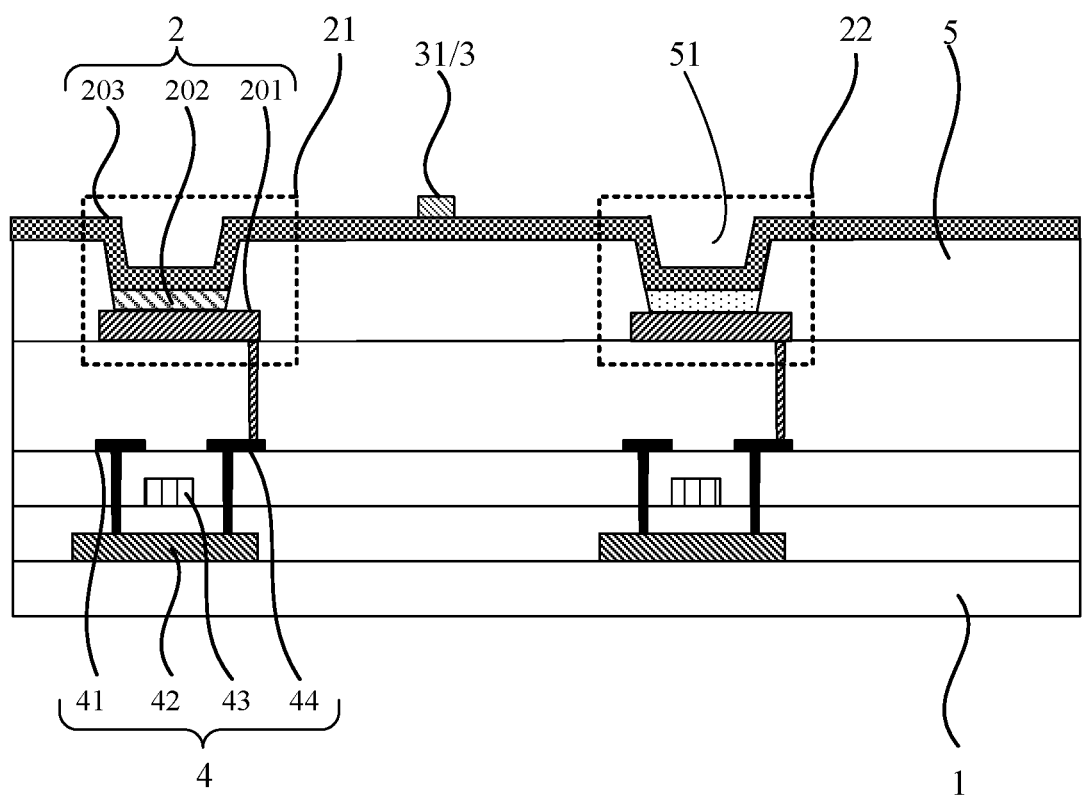
FIG. 14 is a cross-sectional view of a portion of another display panel according to an embodiment of the present disclosure.

FIG. 14 is a cross-sectional view of a portion of another display panel according to an embodiment of the present disclosure. Referring to FIG. 14, the display panel further includes a pixel defining layer 5, the pixel defining layer 5 is provided with multiple first openings 51, and the organic light-emitting unit 2 is located in the first opening 51. The quantum dot light-emitting unit 3 is located on a side of the pixel defining layer 5 facing away from the substrate 1. In the embodiment of the present disclosure, the quantum dot light-emitting unit 3 is disposed on a side of the pixel defining layer 5 facing away from the substrate 1, and the quantum dot light-emitting unit 3 is located on the forward light-emitting side of the light-emitting function layer 202, and the intensity of light irradiating the quantum dot light-emitting unit 3 is increased, and the light-emitting brightness of the quantum dot light-emitting unit 3 is increased.

In an embodiment, referring to FIG. 14, the quantum dot light-emitting unit 3 is disposed on a surface of a film layer or between two adjacent film layers located on a side of the pixel defining layer 5 facing away from the substrate 1, so that no opening needs to be provided for the quantum dot light-emitting unit 3. The manufacturing process of the display panel is simplified. Exemplarily, as shown in FIG. 14, the second electrode 203 is a surface electrode, the second electrode 203 covers the light-emitting function layer 202 in the first opening 51, and the second electrode 203 also covers the pixel defining layer 5 between two adjacent first openings 51. The quantum dot light-emitting unit 3 is located on a surface of a side of the second electrode 203 facing away from the substrate 1. In other embodiments, the quantum dot light-emitting unit 3 may be further provided between the second electrode 203 and the pixel defining layer 5.

Figure 15:
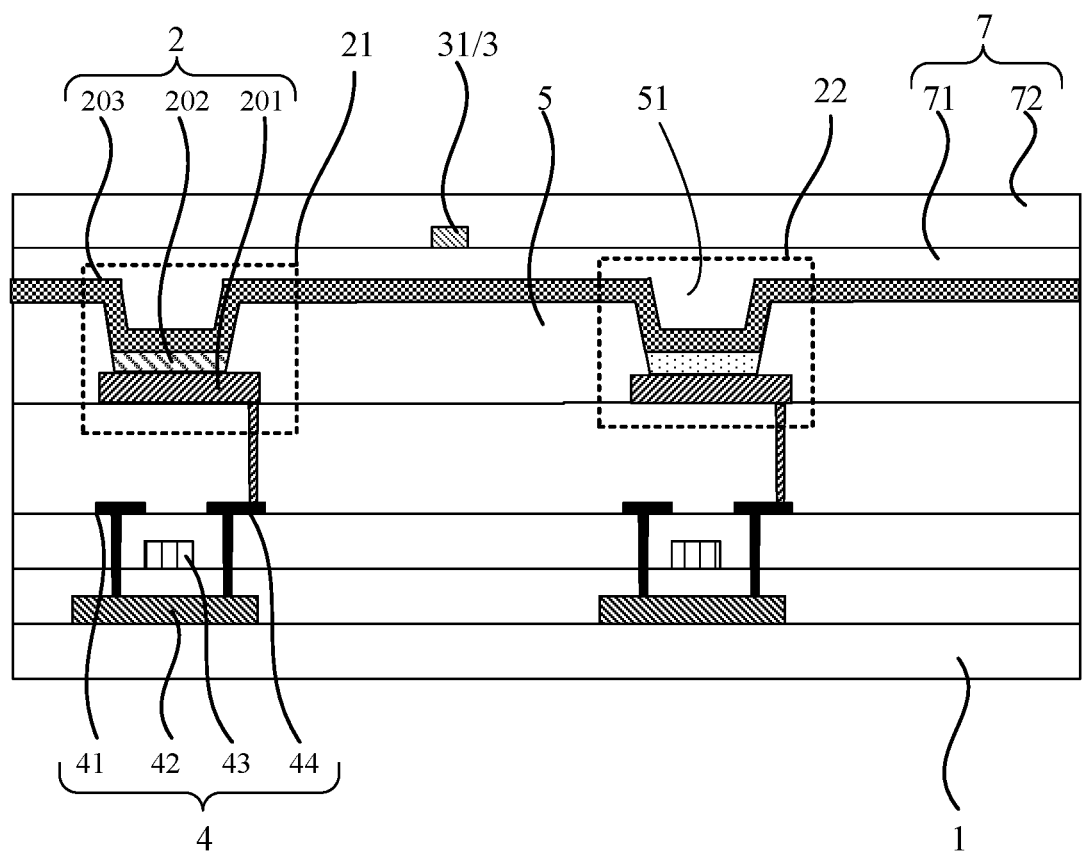
FIG. 15 is a cross-sectional view of a portion of another display panel according to an embodiment of the present disclosure.

FIG. 15 is a cross-sectional view of a portion of another display panel according to an embodiment of the present disclosure. Referring to FIG. 15, the display panel further includes a thin film encapsulation layer 7 located on a side of an organic light-emitting unit 2 facing away from a substrate 1. The thin film encapsulation layer 7 includes a first insulating layer 71 and a second insulating layer 72. In an embodiment, the first insulating layer 71 is located between the second insulating layer 72 and the substrate 1, in the embodiment of the present disclosure, an example that the first insulating layer 71 is located between the second insulating layer 72 and the substrate 1 is used for explanation, and in other embodiments, the second insulating layer 72 may be located between the first insulating layer 71 and the substrate 1. In a direction perpendicular to a plane where the substrate 1 is located, the quantum dot light-emitting unit 3 is located between the first insulating layer 71 and the second insulating layer 72. In the embodiment of the present disclosure, the quantum dot light-emitting unit 3 is located between the first insulating layer 71 and the second insulating layer 72 of the thin film encapsulation layer 7. Before the quantum dot light-emitting unit 3 is formed, the first insulating layer 71 of the thin film encapsulation layer 7 has been formed. The first insulating layer 71 can protect the organic light-emitting unit 2, so that the organic light-emitting unit 2 is protected from corrosion of water vapor and oxygen during the process of forming the quantum dot light-emitting unit 3. After the quantum dot light-emitting unit 3 is formed, the second insulating layer 72 of the thin film encapsulation layer 7 is formed. The second insulating layer 72 and the first insulating layer 71 wrap the quantum dot light-emitting unit 3 to protect the quantum dot light-emitting unit 3 from corrosion of water vapor and oxygen, and also protect the quantum dot light-emitting unit 3 from external mechanical damage, which is beneficial for improving the service life of the quantum dot light-emitting unit.

Figure 16:
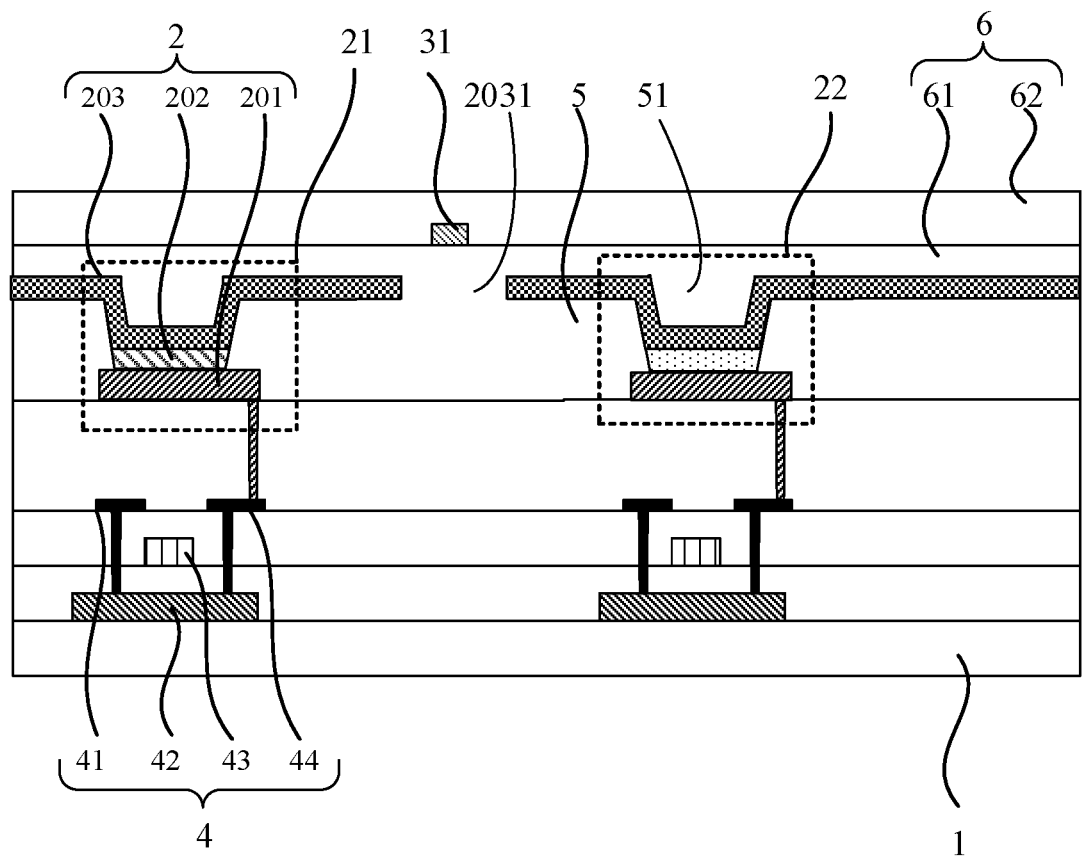
FIG. 16 is a cross-sectional view of a portion of another display panel according to an embodiment of the present disclosure.

FIG. 16 is a cross-sectional view of a portion of another display panel according to an embodiment of the present disclosure. Referring to FIG. 16, a second electrode 203 is located on a side of the light-emitting function layer 202 facing away from a substrate 1, and the second electrode 203 is provided with at least one third opening 2031 in the display region A1. In a direction perpendicular to a plane where the substrate 1 is located, the third opening 2031 overlaps a quantum dot light-emitting unit 3. In the embodiment of the present disclosure, the second electrode 203 is provided with a third opening 2031 at a position overlapping the quantum dot light-emitting unit 3, and the second electrode 203 is prevented from blocking light. In the direction perpendicular to the plane where the substrate 1 is located, when the quantum dot light-emitting unit 3 is located on the side of the second electrode 203 facing away from the substrate 1, the third opening 2031 increases the intensity of light irradiating the quantum dot light-emitting unit 3, and the light-emitting intensity of the quantum dot light-emitting unit 3 is increased. In some embodiments, in the direction perpendicular to the plane where the substrate 1 is located, when the quantum dot light-emitting unit 3 is located between the second electrode 203 and the substrate 1, the third opening 2031 increases the transmittance of light emitted by the quantum dot light-emitting unit 3, and the intensity of the light emitted by the quantum dot light-emitting unit 3 to the outside the display panel is increased.

Figure 17:
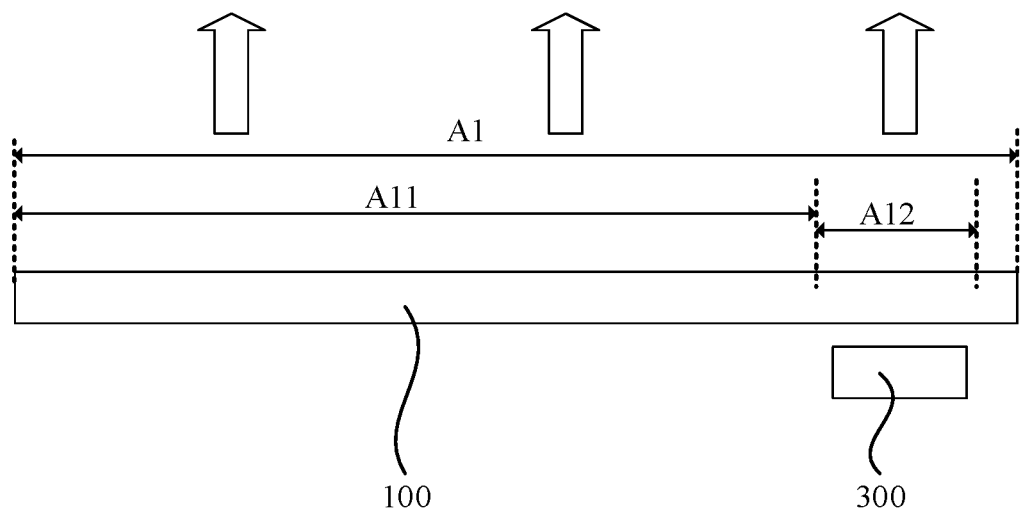
FIG. 17 is a schematic structure view of a display device according to an embodiment of the present disclosure.

An embodiment of the present disclosure further provides a display device. FIG. 17 is a schematic structure view of a display device according to the embodiment of the present disclosure. As shown in FIG. 17, a display device provided by the embodiment of the present disclosure includes the display panel 100 described in any embodiment of the present disclosure. The display device provided in the embodiment of the present disclosure may be a mobile phone, or may be a computer, a television, an smart wearable device, or the like, which is not limited in the embodiment of the present disclosure.

In an embodiment, referring to FIG. 17, the display device further includes a light sensing element 300, the light sensing element 300 is located on a side facing away from a light-emitting display side (the arrow direction in FIG. 17 indicates the light-emitting direction of the display panel 100) of the display panel 100, the light sensing element 300 is located in the second display region A12, and the second display region A12 is reused as a light sensing element setting region. The light sensing element 300 may be an optical component or a photoelectric component. The external ambient light penetrates the second display region A12 of the display panel and reaches the light sensing element 300, and functions such as photographing are implemented.

What is claimed is:
1. A display panel, comprising:
a display region, wherein the display region comprises:
a first display region and a second display region;
wherein the display panel comprises:
a substrate; and
a plurality of organic light-emitting units, which is located in the display region on a first side of the substrate;
wherein the plurality of organic light-emitting units is arranged in at least of following manners: an area of at least one of the plurality of organic light-emitting units in the second display region is smaller than an area of each of the plurality of organic light-emitting units with a same light-emitting color in the first display region, or density of the plurality of organic light-emitting units in the first display region is greater than a density of the plurality of organic light-emitting units in the second display region; and wherein the second display region comprises at least one quantum dot light-emitting unit, and the at least one quantum dot light-emitting unit does not overlap the plurality of organic light-emitting units in a direction perpendicular to a plane where the display panel is located; and each of the at least one quantum dot light-emitting unit emits light of a same color as at least one of the plurality of organic light-emitting units located in the second display region.

2. The display panel of claim 1, wherein the plurality of organic light-emitting units comprises:

a first organic light-emitting unit and a second organic light-emitting unit, the first organic light-emitting unit is configured to emit light in a first waveband, and the second organic light-emitting unit is configured to emit light in a second waveband; and a wavelength of the light in the first waveband is greater than a wavelength of the light in the second waveband; and wherein the at least one quantum dot light-emitting unit comprises a first quantum dot light-emitting unit, a vertical projection of the first quantum dot light-emitting unit on a plane where the substrate is located is a first quantum dot pattern, a vertical projection of the first organic light-emitting unit on the plane where the substrate is located is a first organic pattern, the first quantum dot pattern is adjacent to the first organic pattern, and the first quantum dot light-emitting unit converts the light in the second waveband irradiating the first quantum dot light-emitting unit into the light in the first waveband.

3. The display panel of claim 2, wherein the light in the first waveband is red light, and the light in the second waveband is green light or blue light; or wherein the light in the first waveband is green light, and the light in the second waveband is blue light.

4. The display panel of claim 2, wherein the plurality of organic light-emitting units comprises a third organic light-emitting unit, the third organic light-emitting unit is configured to emit light in a third waveband, the third waveband does not overlap the first waveband, and a wavelength of the light in the third waveband is greater than the wavelength of the light in the second waveband; and wherein the at least one quantum dot light-emitting unit further comprises a second quantum dot light-emitting unit, a vertical projection of the second quantum dot light-emitting unit on the plane where the substrate is located is a second quantum dot pattern, a vertical projection of the third organic light-emitting unit on the plane where the substrate is located is a third organic pattern, the second quantum dot pattern is adjacent to the third organic pattern, and the second quantum dot light-emitting unit converts the light in the second waveband irradiating the second quantum dot light-emitting unit into the light in the third waveband.

5. The display panel of claim 4, comprising:

a plurality of quantum dot light-emitting units;

wherein in the second display region, each first organic light-emitting unit has at least one adjacent quantum dot light-emitting unit which emits light of a same color as the each first organic light-emitting unit; and wherein in the second display region, each third organic light-emitting unit has at least one adjacent quantum dot light-emitting unit which emits light of a same color as each third organic light-emitting unit.

6. The display panel of claim 4, wherein the first quantum dot light-emitting unit is located between one first organic light-emitting unit and one second organic light-emitting unit; and wherein the second quantum dot light-emitting unit is located between one third organic light-emitting unit and one second organic light-emitting unit.

7. The display panel of claim 2, wherein the second display region comprises: a first edge organic light-emitting unit adjacent to the first display region, and between the first edge organic light-emitting unit and an organic light-emitting unit closest to the second display region in the first display region, no other organic light-emitting units that emit light of a same color as the first edge organic light-emitting unit are comprised; and each first edge organic light-emitting unit has at least one adjacent quantum dot light-emitting unit which emits emit light of a same color as each first edge organic light-emitting unit.

8. The display panel of claim 2, comprising:

a plurality of pixels arranged in an array, wherein each of the plurality of pixels at least comprises the first organic light-emitting unit, the second organic light-emitting unit, and the first quantum dot light-emitting unit.

9. The display panel of claim 1, wherein the first display region comprises:

at least one quantum dot light-emitting unit, and an area of each of the at least one quantum dot light-emitting unit located in the first display region is smaller than an area of a respective one of the at least one quantum dot light-emitting unit located in the second display region with a same light-emitting color.

10. The display panel of claim 1, wherein the display region further comprises a third display region located between the first display region and the second display region, and a plurality of quantum dot light-emitting units are at least located in the second display region and the third display region;

wherein an area of at least one of the plurality of organic light-emitting units in the second display region is smaller than an area of each of the plurality of organic light-emitting units with a same light-emitting color in the third display region, and an area of at least one of the plurality of organic light-emitting units in the third display region is smaller than an area of each of the plurality of organic light-emitting units with a same light-emitting color in the first display region; and wherein an area of each of the at least one quantum dot light-emitting unit located in the second display region is larger than an area of each dot light-emitting unit located in the third display region with a same light-emitting color.

11. The display panel of claim 10, wherein a plurality of quantum dot light-emitting units are further located in the first display region; and wherein an area of each quantum dot light-emitting unit located in the third display region is larger than an area of each quantum dot light-emitting unit located in the first display region with a same light-emitting color.

12. The display panel of claim 1, wherein each of the plurality of organic light-emitting units comprises a first electrode, a light-emitting function layer and a second electrode, and the light-emitting function layer is located between the first electrode and the second electrode; and wherein in a direction perpendicular to a plane where the substrate is located, a minimum distance between the at least one quantum dot light-emitting unit and the substrate is greater than or equal to a minimum distance between the light-emitting function layer and the substrate.

13. The display panel of claim 12, comprising: a pixel defining layer, wherein the pixel defining layer is provided with a plurality of first openings in the display region, the plurality of first openings exposes the first electrode, and the plurality of organic light-emitting units is located in the plurality of first openings;

wherein the pixel defining layer is further provided with at least one second opening in the display region, and the at least one quantum dot light-emitting unit is located in the at least one second opening.

14. The display panel of claim 13, wherein the at least one second opening penetrates the pixel defining layer, the display panel further comprises: a spacer layer located in the at least one second opening, and the spacer layer is located between the substrate and the at least one quantum dot light-emitting unit.

15. The display panel of claim 13, wherein a depth of the at least one second opening in a thickness direction of the display panel is smaller than a thickness of the pixel defining layer, and the pixel defining layer is exposed at a bottom of the at least one second opening; wherein the bottom of the at least one second opening is an end of the at least one second opening adjacent to the substrate.

16. The display panel of claim 12, comprising: a pixel defining layer, wherein the pixel defining layer is provided with a plurality of first openings, and the plurality of organic light-emitting units is located in the plurality of first openings;

wherein the at least one quantum dot light-emitting unit is located on a side of the pixel defining layer facing away from the substrate.

17. The display panel of claim 16, comprising:

a thin film encapsulation layer located on a side of the plurality of organic light-emitting units facing away from the substrate; wherein the thin film encapsulation layer comprises a first insulating layer and a second insulating layer; and wherein in a direction perpendicular to a plane where the substrate is located, the at least one quantum dot light-emitting unit is located between the first insulating layer and the second insulating layer.

18. The display panel of claim 12, wherein the second electrode is located on a side of the light-emitting function layer facing away from the substrate, and the second electrode is provided with at least one third opening in the display region; and in the direction perpendicular to the plane where the substrate is located, the at least one third opening overlaps the at least one quantum dot light-emitting unit.

19. A display device, comprising;

a display panel, wherein the display panel comprises:

a display region, wherein the display region comprises a first display region and a second display region;

wherein the display panel comprises:

a substrate; and a plurality of organic light-emitting units, which is located in the display region on a first side of the substrate; wherein the plurality of organic light-emitting units is arranged in at least of following manners: an area of at least one of the plurality of organic light-emitting units in the second display region is smaller than an area of each of the plurality of organic light-emitting units with a same light-emitting color in the first display region, or density of the plurality of organic light-emitting units in the first display region is greater than a density of the plurality of organic light-emitting units in the second display region; and wherein the second display region comprises at least one quantum dot light-emitting unit, and the at least one quantum dot light-emitting unit does not overlap the plurality of organic light-emitting units in a direction perpendicular to a plane where the display panel is located; and each of the at least one quantum dot light-emitting unit emits light of a same color as at least one of the plurality of organic light-emitting units located in the second display region.

20. The display device of claim 19, further comprising a light sensing element, wherein the light sensing element is located on a side facing away from a light-emitting display side of the display panel and located in the second display region.

* * * * *